(12) United States Patent
Kadota et al.

(10) Patent No.: US 12,400,044 B2
(45) Date of Patent: Aug. 26, 2025

(54) DIMENSION CREATION DEVICE, DIMENSION CREATION METHOD, AND RECORDING MEDIUM

(71) Applicant: Mitsubishi Electric Corporation, Tokyo (JP)

(72) Inventors: Koya Kadota, Tokyo (JP); Shoki Fujii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 142 days.

(21) Appl. No.: 17/781,591

(22) PCT Filed: Feb. 3, 2021

(86) PCT No.: PCT/JP2021/003891
§ 371 (c)(1),
(2) Date: Jun. 1, 2022

(87) PCT Pub. No.: WO2021/161865
PCT Pub. Date: Aug. 19, 2021

(65) Prior Publication Data
US 2023/0004687 A1    Jan. 5, 2023

(30) Foreign Application Priority Data

Feb. 13, 2020    (JP) .................................. 2020-022114

(51) Int. Cl.
*G06F 30/10*    (2020.01)
(52) U.S. Cl.
CPC .................................. *G06F 30/10* (2020.01)
(58) Field of Classification Search
CPC ............................................................ G06F 30/10
See application file for complete search history.

(56) References Cited

U.S. PATENT DOCUMENTS 4,694,404 A * 9/1987 Meagher ................. G06T 15/40
345/423
4,855,939 A * 8/1989 Fitzgerald, Jr. ......... G06T 17/10
703/1

(Continued)

FOREIGN PATENT DOCUMENTS

JP    H0757120 A    3/1995
JP    H0765057 A    3/1995

(Continued)

OTHER PUBLICATIONS

International Search Report (PCT/ISA/210), with translation, and Written Opinion (PCT/ISA/237) mailed on Apr. 27, 2021, by the Japan Patent Office as the International Searching Authority for International Application No. PCT/JP2021/003891. (10 pages).

*Primary Examiner* — Charles L Beard
(74) *Attorney, Agent, or Firm* — BUCHANAN, INGERSOLL & ROONEY PC

(57) ABSTRACT

In a dimension creation device, an element selector selects a first target element and a second target element from elements of a three-dimensional model. A direction indicator indicates a direction of a dimension to be created. A dimension creator creates, when the element selector selects a vertex or an edge as each of the first target element and the second target element and the three-dimensional model includes a first orthogonal face including the first target element and orthogonal to the direction indicated by the direction indicator and a second orthogonal face including the second target element and orthogonal to the direction indicated by the direction indicator, the dimension between the first orthogonal face and the second orthogonal face in the direction indicated by the direction indicator in a manner associated with the first orthogonal face and the second orthogonal face.

13 Claims, 17 Drawing Sheets

(56) References Cited

U.S. PATENT DOCUMENTS

| | | | | |
|---|---|---|---|---|
| 4,858,150 A * | 8/1989 | Aizawa | G06T 19/20 | 345/420 |
| 5,003,498 A * | 3/1991 | Ota | G06T 17/10 | 345/420 |
| 5,101,363 A * | 3/1992 | Rutkowski | G05B 19/4069 | 700/182 |
| 5,129,054 A * | 7/1992 | Alstad | G06T 3/073 | 715/766 |
| 5,297,241 A * | 3/1994 | Hirr, Jr. | G06T 19/00 | 345/419 |
| 5,303,337 A * | 4/1994 | Ishida | G06T 19/20 | 715/849 |
| 5,379,371 A * | 1/1995 | Usami | G06T 17/20 | 345/428 |
| 5,388,199 A * | 2/1995 | Kakazu | G06T 19/00 | 715/964 |
| 5,390,294 A * | 2/1995 | Takeuchi | G06T 17/00 | 345/441 |
| 5,428,715 A * | 6/1995 | Suzuki | G05B 19/4097 | 345/419 |
| 5,444,831 A * | 8/1995 | Seki | G06T 11/00 | 345/619 |
| 5,488,692 A * | 1/1996 | Karasick | G06T 19/20 | 345/420 |
| 5,548,698 A * | 8/1996 | Smith | G06T 17/00 | 345/660 |
| 5,548,706 A * | 8/1996 | Koizumi | G06T 19/00 | 715/255 |
| 5,548,707 A * | 8/1996 | LoNegro | G06T 19/00 | 715/255 |
| 5,566,286 A * | 10/1996 | Minami | G06T 19/00 | 345/589 |
| 5,615,317 A * | 3/1997 | Freitag | G06T 17/10 | 700/182 |
| 5,625,827 A * | 4/1997 | Krause | G06T 7/60 | 702/155 |
| 5,659,774 A * | 8/1997 | Saito | G06F 30/00 | 358/1.18 |
| 5,682,468 A * | 10/1997 | Fortenbery | G06T 19/00 | 345/419 |
| 5,701,403 A * | 12/1997 | Watanabe | G06T 17/10 | 345/419 |
| 5,729,750 A * | 3/1998 | Ishida | G06T 17/00 | 715/255 |
| 5,734,383 A * | 3/1998 | Akimichi | G06T 17/10 | 345/420 |
| 5,821,941 A * | 10/1998 | Millstein | G06T 17/00 | 345/678 |
| 5,828,575 A * | 10/1998 | Sakai | G05B 19/4097 | 700/182 |
| 5,886,897 A * | 3/1999 | Hazama | G05B 19/4097 | 700/182 |
| 5,923,336 A * | 7/1999 | Kaercher | G06F 30/00 | 345/629 |
| 5,949,420 A * | 9/1999 | Terlutter | H04N 13/305 | 348/42 |
| 5,990,897 A * | 11/1999 | Hanratty | G06T 15/10 | 345/420 |
| 5,999,186 A * | 12/1999 | Jackson | G06T 19/20 | 345/420 |
| 6,037,945 A * | 3/2000 | Loveland | G06Q 10/06 | 700/107 |
| 6,104,404 A * | 8/2000 | Masuda | G06T 17/10 | 345/420 |
| 6,219,055 B1 * | 4/2001 | Bhargava | G06T 17/10 | 700/98 |
| 6,232,985 B1 * | 5/2001 | Chase | G06T 11/60 | 345/441 |
| 6,233,538 B1 * | 5/2001 | Gupta | B21D 5/02 | 703/7 |
| 6,256,595 B1 * | 7/2001 | Schwalb | G06T 19/00 | 715/252 |
| 6,281,907 B1 * | 8/2001 | Baumann | G06T 19/00 | 345/660 |
| 6,396,522 B1 * | 5/2002 | Vu | G06F 3/04845 | 715/848 |
| 6,448,964 B1 * | 9/2002 | Isaacs | G06F 3/04845 | 345/419 |
| 6,597,355 B1 * | 7/2003 | Kulkarni | G06T 17/10 | 703/1 |
| 6,628,279 B1 * | 9/2003 | Schell | G06F 3/04845 | 345/420 |
| 6,654,027 B1 * | 11/2003 | Hernandez | G06T 19/00 | 715/822 |
| 6,677,943 B1 * | 1/2004 | Casu | G06T 19/20 | 345/420 |
| 6,917,842 B2 * | 7/2005 | Shimizu | G06T 19/00 | 700/95 |
| 6,954,679 B1 * | 10/2005 | Takeda | G05B 19/4097 | 700/165 |
| 7,027,963 B2 * | 4/2006 | Watanabe | B25J 9/1671 | 700/182 |
| 7,039,569 B1 * | 5/2006 | Haws | G06F 30/13 | 707/999.102 |
| 7,119,805 B2 * | 10/2006 | Batori | G06T 19/00 | 715/848 |
| 7,441,201 B1 * | 10/2008 | Printezis | G06F 9/451 | 715/848 |
| 7,639,267 B1 * | 12/2009 | Desimone | G06T 15/00 | 345/619 |
| 7,830,373 B1 * | 11/2010 | Gao | G06F 30/13 | 345/419 |
| 8,384,717 B2 * | 2/2013 | Huang | G06T 17/10 | 345/441 |
| 8,817,028 B2 * | 8/2014 | Yadav | G06F 30/00 | 345/474 |
| 8,902,219 B1 * | 12/2014 | Hauswirth | G06T 19/00 | 345/419 |
| 8,935,138 B2 * | 1/2015 | Erdim | G06F 30/00 | 703/7 |
| 9,581,992 B2 * | 2/2017 | Nakano | G05B 19/4097 | |
| 9,607,422 B1 * | 3/2017 | Leedom | G06F 30/23 | |
| 9,886,528 B2 * | 2/2018 | Rameau | G06T 17/00 | |
| 10,121,286 B2 * | 11/2018 | Alsaffar | G06T 17/10 | |
| 10,242,484 B1 * | 3/2019 | Cernigliaro | G06F 9/008 | |
| 10,311,169 B1 * | 6/2019 | Leedom | G06F 30/23 | |
| 10,984,606 B1 * | 4/2021 | Dalmia | G06F 30/12 | |
| 11,574,084 B1 * | 2/2023 | Marusich | G06F 30/17 | |
| 11,854,112 B1 * | 12/2023 | Mammou | G06T 9/001 | |
| 11,947,876 B2 * | 4/2024 | Gibbens | G06F 30/17 | |
| 2001/0018622 A1 * | 8/2001 | Asano | B29C 33/3842 | 700/98 |
| 2001/0043209 A1 * | 11/2001 | Nagakura | G06T 17/10 | 345/619 |
| 2002/0060685 A1 * | 5/2002 | Handley | G06T 17/05 | 345/582 |
| 2003/0071810 A1 * | 4/2003 | Shoov | G06F 30/00 | 345/420 |
| 2003/0210244 A1 * | 11/2003 | Sasago | G06T 19/00 | 700/98 |
| 2004/0049306 A1 * | 3/2004 | Shimizu | G06T 17/00 | 700/96 |
| 2004/0153824 A1 * | 8/2004 | Devarajan | G06T 17/00 | 714/38.1 |
| 2004/0249809 A1 * | 12/2004 | Ramani | G06F 16/5854 | |
| 2005/0028111 A1 * | 2/2005 | Schrag | G06F 3/04815 | 715/848 |
| 2005/0093860 A1 * | 5/2005 | Yanagisawa | G06T 15/10 | 700/98 |
| 2006/0044308 A1 * | 3/2006 | Akutsu | G06T 19/00 | 345/423 |
| 2006/0094951 A1 * | 5/2006 | Dean | G06T 17/10 | 600/407 |
| 2006/0161290 A1 * | 7/2006 | Takahashi | G05B 19/40937 | 700/182 |
| 2006/0259172 A1 * | 11/2006 | Trammell | G06Q 30/0603 | 700/97 |

(56) References Cited

U.S. PATENT DOCUMENTS

| | | | |
|---|---|---|---|
| 2007/0055401 A1* | 3/2007 | Van Bael | G06F 30/00 700/98 |
| 2007/0146362 A1* | 6/2007 | Yanagishita | G06F 30/00 345/420 |
| 2007/0285425 A1* | 12/2007 | Bae | G06F 30/00 345/441 |
| 2007/0288209 A1* | 12/2007 | Watanabe | G06T 17/10 703/2 |
| 2008/0049046 A1* | 2/2008 | Bae | G06T 11/60 345/689 |
| 2008/0238916 A1* | 10/2008 | Ghosh | G06T 19/00 345/419 |
| 2008/0297503 A1* | 12/2008 | Dickinson | G06T 17/10 345/420 |
| 2009/0242619 A1* | 10/2009 | Blomberg | B65D 90/046 493/162 |
| 2010/0142826 A1* | 6/2010 | Kotake | G06T 7/75 382/203 |
| 2010/0185310 A1* | 7/2010 | Miyata | G05B 19/40937 700/98 |
| 2010/0201684 A1* | 8/2010 | Yadav | G06T 19/00 715/764 |
| 2010/0232683 A1* | 9/2010 | Fujieda | G06T 7/344 382/154 |
| 2011/0050686 A1* | 3/2011 | Nojima | G06F 3/04815 345/419 |
| 2011/0066963 A1* | 3/2011 | Schrag | G06F 3/04815 715/848 |
| 2011/0098983 A1* | 4/2011 | Staples | G06T 19/20 703/1 |
| 2012/0030630 A1* | 2/2012 | Grossman | G06T 19/003 715/850 |
| 2012/0032958 A1* | 2/2012 | Werline | G06T 19/20 345/419 |
| 2012/0089242 A1* | 4/2012 | Iriguchi | G05B 19/40931 700/98 |
| 2012/0089246 A1* | 4/2012 | Mitani | G05B 19/4097 700/159 |
| 2012/0278782 A1* | 11/2012 | Pal | G06F 30/00 716/122 |
| 2012/0321878 A1* | 12/2012 | Landon | B22F 10/85 264/497 |
| 2013/0127848 A1* | 5/2013 | Joshi | G06T 17/20 345/420 |
| 2013/0144569 A1* | 6/2013 | Abe | G06F 30/13 703/1 |
| 2013/0190918 A1* | 7/2013 | Matsubara | G05B 19/18 700/159 |
| 2013/0282328 A1* | 10/2013 | Sato | G05B 19/401 702/150 |
| 2014/0358493 A1* | 12/2014 | Soman | G06T 19/00 703/1 |
| 2015/0170424 A1* | 6/2015 | Golovinskiy | G06T 19/20 703/1 |
| 2015/0279087 A1* | 10/2015 | Myers | G06V 20/64 345/420 |
| 2016/0055266 A1* | 2/2016 | Tomono | G06F 30/17 703/1 |
| 2016/0055267 A1* | 2/2016 | Tomono | G06F 30/17 703/1 |
| 2017/0061037 A1* | 3/2017 | Makem | G06F 30/23 |
| 2017/0330305 A1* | 11/2017 | Clow | G06F 15/10 |
| 2018/0095448 A1* | 4/2018 | Vernon | G06F 30/23 |
| 2018/0167634 A1* | 6/2018 | Salmimaa | H04N 19/167 |
| 2018/0350142 A1* | 12/2018 | Maruyama | G06T 19/00 |
| 2018/0376126 A1* | 12/2018 | Hannuksela | H04N 19/59 |
| 2019/0268599 A1* | 8/2019 | Hannuksela | G03B 37/00 |
| 2020/0089819 A1* | 3/2020 | Gauderis | G06T 17/10 |
| 2020/0134106 A1* | 4/2020 | Suomi | G06F 30/20 |
| 2020/0233995 A1* | 7/2020 | Yoshida | G06F 30/28 |
| 2020/0288171 A1* | 9/2020 | Hannuksela | H04N 19/124 |
| 2020/0302091 A1* | 9/2020 | Hamazoe | G06F 30/10 |
| 2021/0073449 A1* | 3/2021 | Segev | G06F 30/27 |
| 2021/0082175 A1* | 3/2021 | Aoki | G06T 17/10 |
| 2021/0248836 A1* | 8/2021 | Maranzana | G06F 30/17 |
| 2022/0020224 A1* | 1/2022 | Sadoudi | G06T 17/20 |
| 2022/0058866 A1* | 2/2022 | Beltrand | G06N 3/08 |
| 2022/0068021 A1* | 3/2022 | Takahashi | G06T 17/005 |
| 2022/0167042 A1* | 5/2022 | Hannuksela | H04N 21/26258 |
| 2022/0292778 A1* | 9/2022 | Suzuki | G06T 19/00 |
| 2022/0327252 A1* | 10/2022 | King | G06F 30/12 |
| 2022/0348374 A1* | 11/2022 | Barger | B65B 59/001 |
| 2022/0350937 A1* | 11/2022 | Martinez Quiroz | G06F 30/10 |
| 2022/0358256 A1* | 11/2022 | Segler | G06F 30/12 |
| 2022/0398351 A1* | 12/2022 | Cui | G06N 3/086 |
| 2022/0398356 A1* | 12/2022 | Brifault | G06F 30/17 |
| 2023/0162427 A1* | 5/2023 | Kaneko | B29C 37/00 345/419 |
| 2023/0288908 A1* | 9/2023 | Usui | G06F 30/12 |
| 2023/0305518 A1* | 9/2023 | Ogihara | G05B 19/4063 |
| 2023/0376639 A1* | 11/2023 | Lambourne | G06V 10/82 |
| 2024/0092037 A1* | 3/2024 | Yang | B29C 70/222 |
| 2024/0292027 A1* | 8/2024 | Mate | H04N 19/597 |

FOREIGN PATENT DOCUMENTS

| | | |
|---|---|---|
| JP | 2004286571 A | 10/2004 |
| JP | 2006072543 A | 3/2006 |
| JP | 2019012435 A | 1/2019 |
| JP | 2020144759 A | 9/2020 |

\* cited by examiner

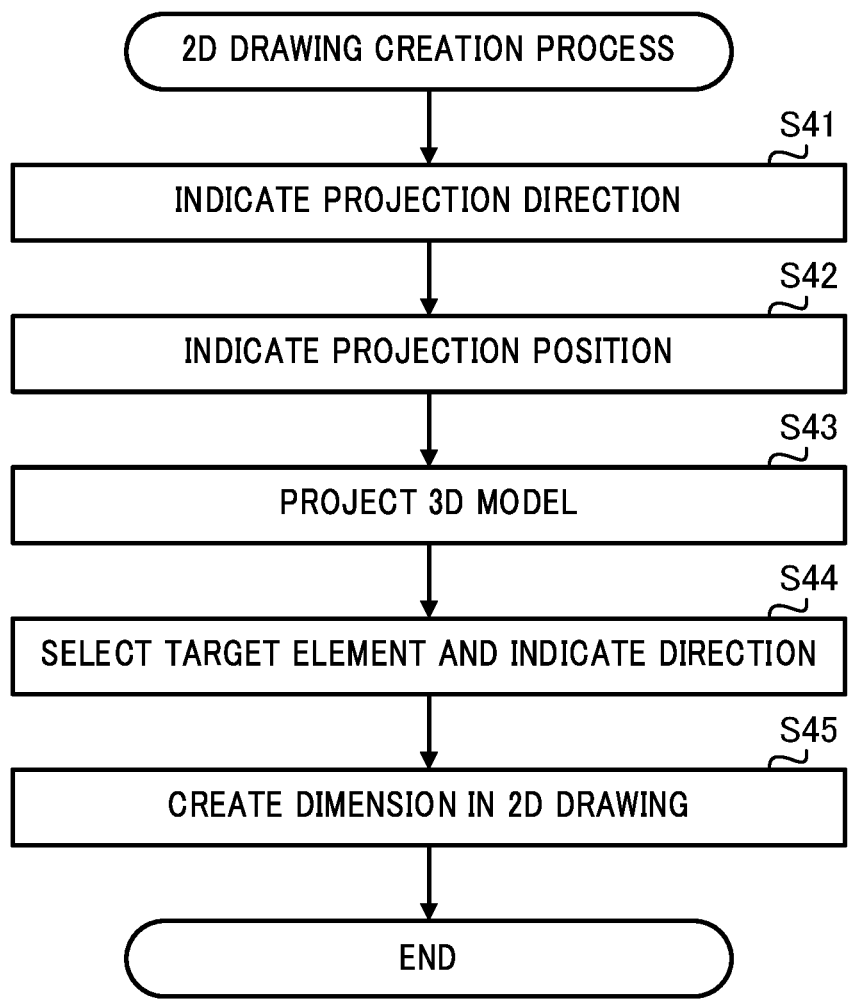

DIMENSION CREATION DEVICE, DIMENSION CREATION METHOD, AND RECORDING MEDIUM

TECHNICAL FIELD

The present disclosure relates to a dimension creation device, a dimension creation method, and a program.

BACKGROUND ART

A technique is known for creating dimensions for a three-dimensional (3D) model and annotating the model with the dimensions. For example, Patent Literature 1 describes a face selection method for creating attribute information including dimensions for a 3D model displayed on a screen with a 3D computer aided design (CAD) device. More specifically, the face selection method described in Patent Literature 1 includes selecting, when an edge of a 3D model is selected, one of the faces forming the selected edge and not displayed on the screen to simplify the procedure of selecting an intended face and reduce the burden on an operator.

CITATION LIST

Patent Literature

Patent Literature 1: Unexamined Japanese Patent Application Publication No. 2006-72543

SUMMARY OF INVENTION

Technical Problem

The dimensions created for a 3D model are to be correctly associated with elements of the 3D model. However, the elements of a 3D model include faces, edges, and vertices. The elements of a 3D model are selected typically by moving or rotating a 3D model displayed on a screen to change the displayed state. While moving or rotating the 3D model displayed on the screen, the operator is to correctly determine and select faces, edges, or vertices as elements to be associated with the dimension. Thus, creating the dimension in a manner correctly associated with the elements of the 3D model takes more time and effort than creating the dimension in a two-dimensional (2D) drawing.

In response to the above issue, an objective of the present disclosure is to provide a dimension creation device and others that can efficiently create a dimension correctly associated with elements of a 3D model.

Solution to Problem

To achieve the above objective, a dimension creation device according to an aspect of the present disclosure includes element selection means for selecting a first target element and a second target element from elements of a three-dimensional model, direction indication means for indicating a direction of a dimension to be created, and dimension creation means for creating, when the element selection means selects a vertex or an edge as each of the first target element and the second target element and the three-dimensional model includes (i) a first orthogonal face including the first target element and orthogonal to the direction indicated by the direction indication means and (ii) a second orthogonal face including the second target element and orthogonal to the direction indicated by the direction indication means, the dimension between the first orthogonal face and the second orthogonal face in the direction indicated by the direction indication means in a manner associated with the first orthogonal face and the second orthogonal face.

Advantageous Effects of Invention

The structure according to the above aspect of the present disclosure selects a first target element and a second target element from elements of a 3D model, indicates a direction of a dimension to be created, and creates, when a vertex or an edge is selected as each of the first target element and the second target element and the 3D model includes a first orthogonal face including the first target element and orthogonal to the indicated direction and a second orthogonal face including the second target element and orthogonal to the indicated direction, the dimension between the first orthogonal face and the second orthogonal face in the indicated direction in a manner associated with the first orthogonal face and the second orthogonal face. Thus, the structure according to the above aspect of the present disclosure can efficiently create dimensions correctly associated with elements of a 3D model.

BRIEF DESCRIPTION OF DRAWINGS

FIG. 26 is a flowchart of a process of creating a 2D drawing in Embodiment 4.

DESCRIPTION OF EMBODIMENTS

Figure 1:
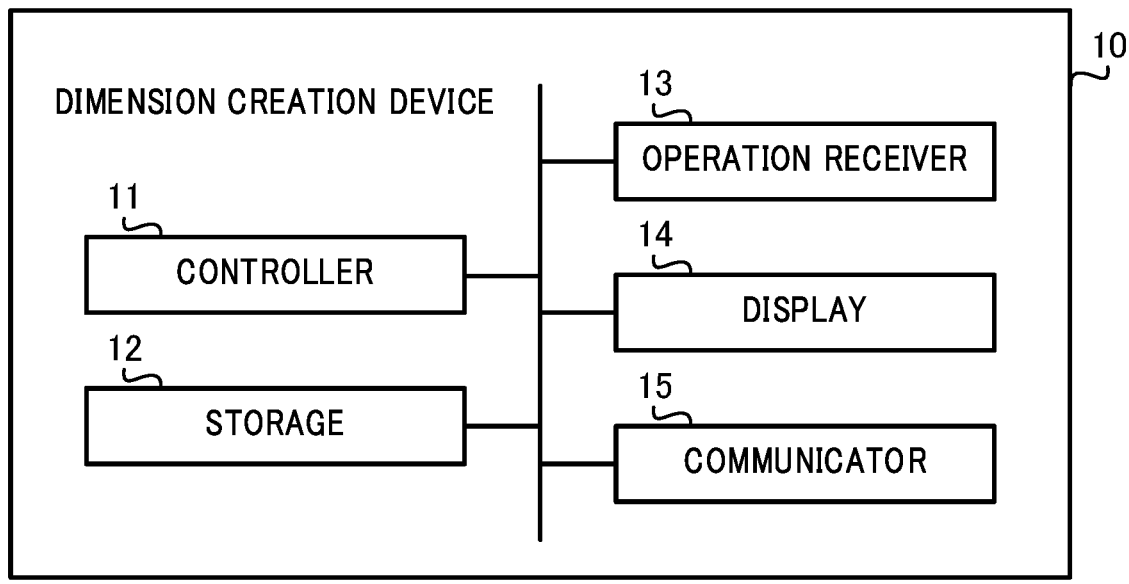
FIG. 1 is a block diagram of a dimension creation device according to Embodiment 1, showing the overall configuration.

Embodiments of the present disclosure will be described below in detail with reference to the drawings. The same reference signs denote the same or corresponding components in the drawings.

Embodiment 1

FIG. 1 is a schematic diagram of a dimension creation device 10 according to Embodiment 1. The dimension creation device 10 is a three-dimensional (3D) CAD device and is also an information processing device that assists in designing an object having a solid shape using a computer. Examples of an object to be designed include a product in the manufacturing process and an element of the product.

The dimension creation device 10 assists in creating a dimension between two elements included in elements of a 3D model. The 3D model herein refers to a model representing a solid shape of an object to be designed. The elements of the 3D model indicate faces, edges, and vertices forming a solid shape of a 3D model. The dimension between two elements indicates the distance, or more specifically, the length between two elements.

Figure 2:
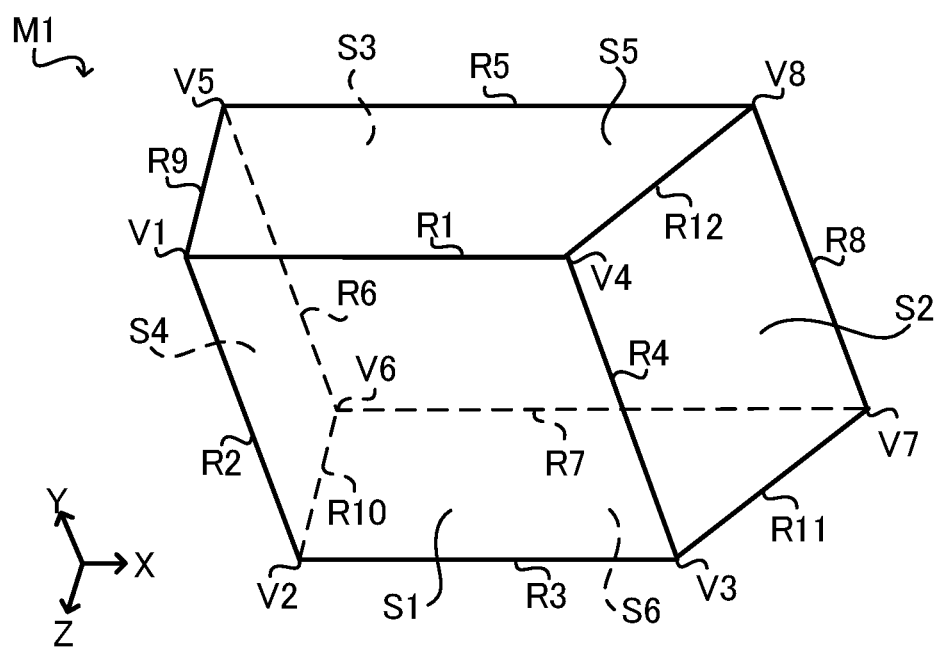
FIG. 2 is a diagram of an example 3D model for which dimensions are created with a dimension creation device according to Embodiment 1.
Figure 3:
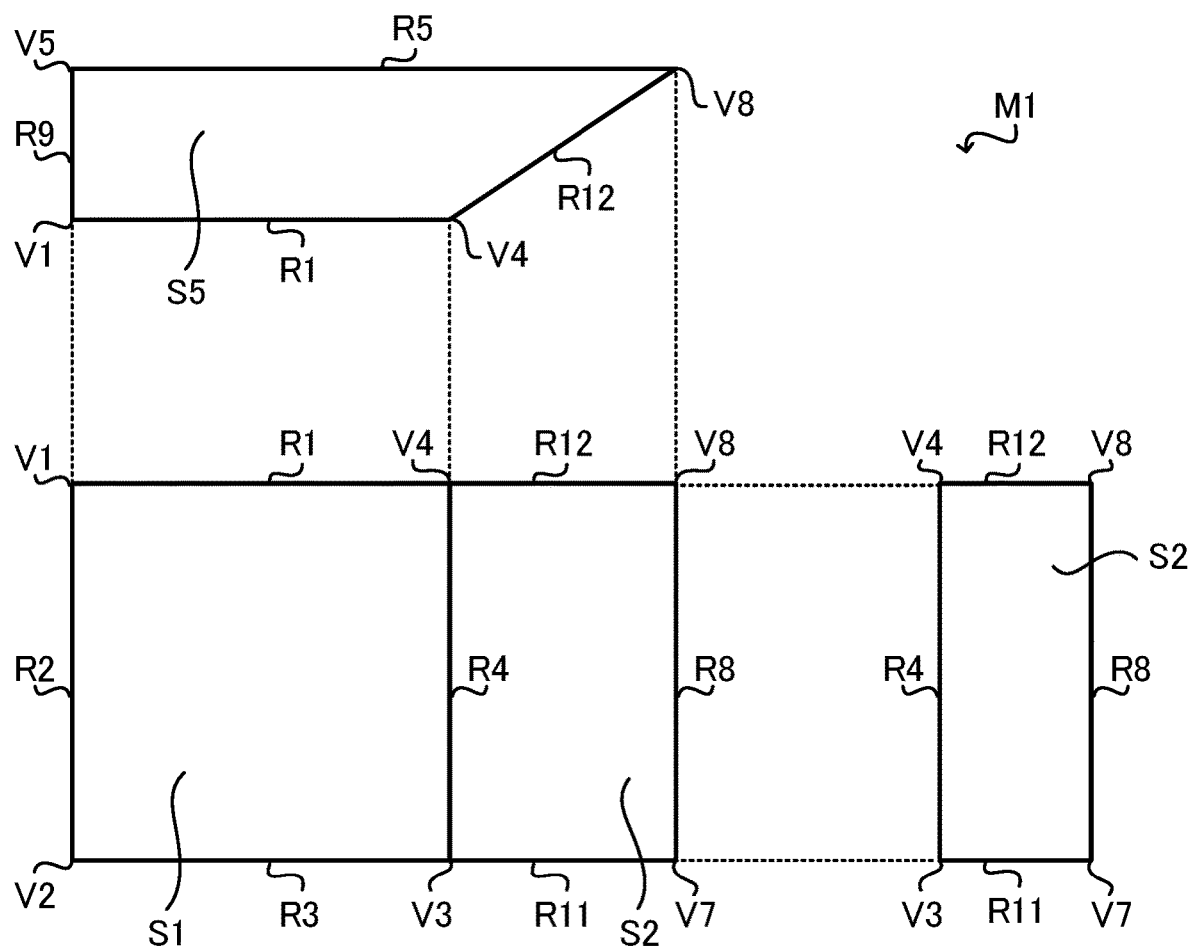
FIG. 3 is a diagram of the 3D model shown in FIG. 2 in a 2D plane.

For example, FIG. 2 shows a 3D model M1. FIG. 3 shows the shape of the 3D model M1 in a two-dimensional (2D) plane when viewed in three directions including the X-direction, the Y-direction, and the Z-direction. As shown in FIGS. 2 and 3, the 3D model M1 represents a hexahedron having six faces S1 to S6, twelve edges R1 to R12, and eight vertices V1 to V8 as elements. More specifically, when viewed in the X-direction, the 3D model M1 is rectangular. When viewed in the Y-direction, the 3D model M1 is trapezoidal, with the face S2 being a slope.

The dimension creation device 10 creates dimensional information indicating the dimension between two elements selected by an operator from multiple faces, multiple edges, and multiple vertices included in the 3D model M1, and annotates the 3D model M1 with the created dimensional information.

The dimensional information created for the 3D model M1 by the dimension creation device 10 is read with software including computer aided manufacturing (CAM) or computer aided testing (CAT), and used for automatically creating a processing program or a measurement program. For example, a computer numeric control (CNC) 3D measuring device can automatically create a measurement program. More specifically, the measuring device can specify, from the dimensions provided to the 3D model M1, two faces associated with the dimensions, and automatically generate an operation path of the measuring device that performs 3D measurement of the faces. The measuring device can also automatically create a program for comparing the results of the 3D measurement with the dimensions.

To correctly read and process the dimensions created by the dimension creation device 10 with such subsequent software, the dimensions created for the 3D model M1 are to be correctly associated with elements of the 3D model M1.

Referring back to FIG. 1, the dimension creation device 10 includes a controller 11, a storage 12, an operation receiver 13, a display 14, and a communicator 15.

The controller 11 includes a central processing unit (CPU), a read-only memory (ROM), and a random-access memory (RAM). The CPU may also be referred to as a central processing device, a central arithmetic device, a processor, a microprocessor, a microcomputer, or a digital signal processor (DSP), and functions as a central arithmetic processing unit that performs processing and arithmetic operations for controlling the dimension creation device 10. In the controller 11, the CPU reads programs and data stored in the ROM, and centrally controls the dimension creation device 10 using the RAM as a work area.

The storage 12 includes a nonvolatile semiconductor memory such as a flash memory, an erasable programmable ROM (EPROM), or an electrically erasable programmable ROM (EEPROM) to serve as a secondary storage or an auxiliary storage. The storage 12 stores programs and data used by the controller 11 to perform various processes. The storage 12 also stores data generated or acquired by the controller 11 through various processes. For example, the storage 12 stores the 3D model M1 read by the dimension creation device 10 and dimensional information created by the dimension creation device 10.

The operation receiver 13 includes input devices such as a keyboard, a mouse, a switch, a touchpad, and a touchscreen to receive operations on the dimension creation device 10 from an operator. For example, the operation receiver 13 receives an operation of reading the 3D model M1, operations of zooming in and out and rotating the 3D model M1 displayed on the display 14, and an operation of selecting any of elements of the 3D model M1.

The display 14 includes a display device such as a liquid crystal display (LCD) panel or an organic electro-luminescence (EL) panel. The display 14 is driven by a display driving circuit (not shown), and displays various images under control of the controller 11. For example, the display 14 displays the 3D model M1 shown in FIG. 2.

The communicator 15 includes a communication interface to communicate with devices external to the dimension creation device 10. For example, the communicator 15 communicates with external devices in accordance with a known communication protocol such as a wireless local area network (LAN), a wired LAN, or a universal serial bus (USB).

The functional configuration of the dimension creation device 10 will now be described with reference to FIG. 4.

Figure 4:
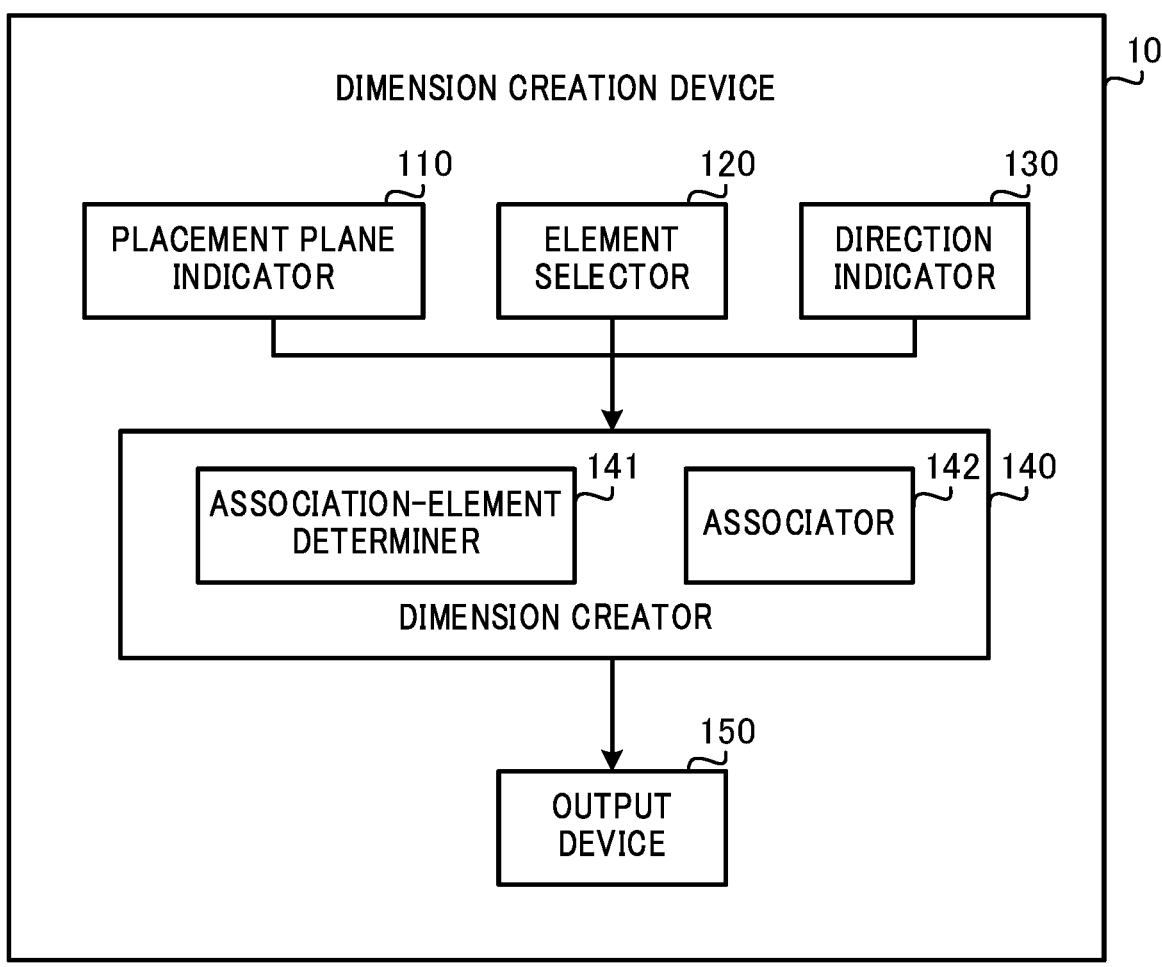
FIG. 4 is a functional block diagram of the dimension creation device according to Embodiment 1.

As shown in FIG. 4, the dimension creation device 10 functionally includes a placement plane indicator 110, an element selector 120, a direction indicator 130, a dimension creator 140, and an output device 150. The dimension creator 140 functions as an association-element determiner 141 and an associator 142. These functions are implemented by software, firmware, or a combination of software and firmware. The software and the firmware are described as programs and stored in the ROM or the storage 12. When the CPU executes the programs stored in the ROM or the storage 12, these functions are implemented.

In the example described below, the dimension creation device 10 creates dimensions for the 3D model M1 shown in FIG. 2.

Figure 5:
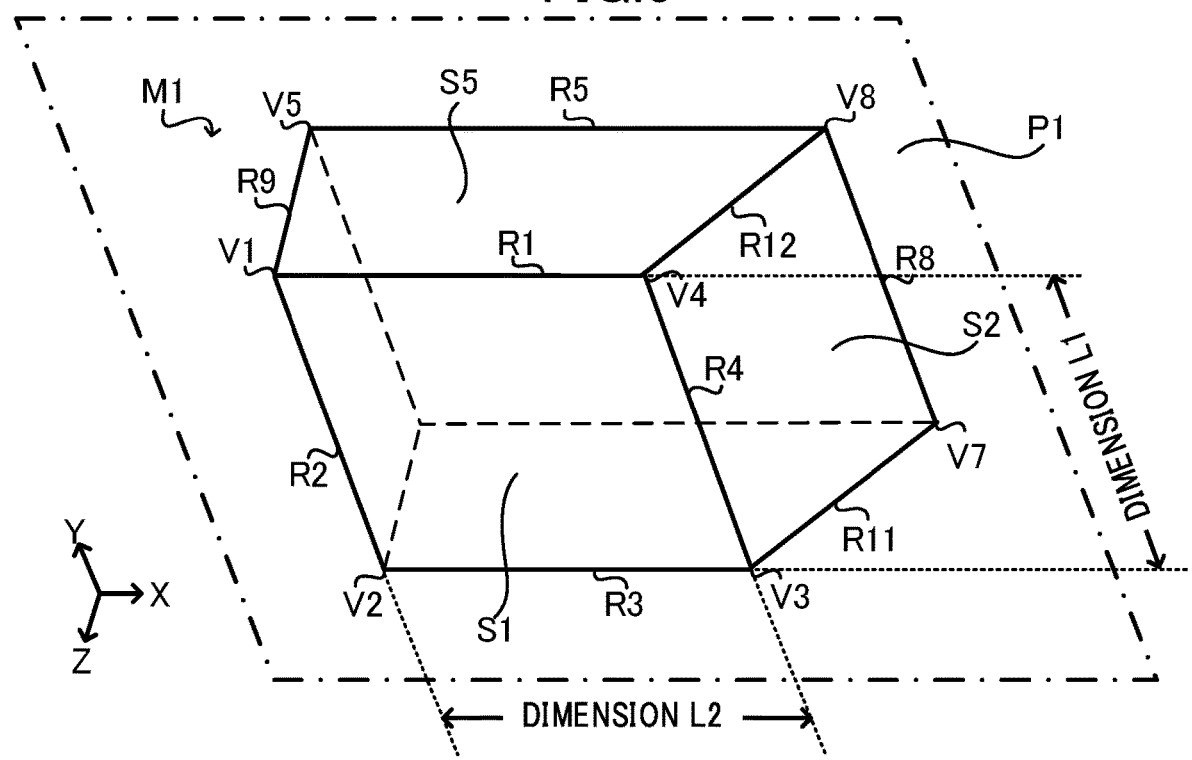
FIG. 5 is a diagram of the 3D model with an example dimension placement plane being indicated in Embodiment 1.

The placement plane indicator 110 indicates a dimension placement plane. The dimension placement plane is a plane in which the dimensions created by the dimension creation device 10 are placed. FIG. 5 shows an example dimension placement plane P1 with a dot-and-dash line. The dimension placement plane P1 is an imaginary plane parallel to the face S1 of the 3D model M1 and at a predetermined distance from the face S1.

The placement plane indicator 110 indicates, for example, the plane shown in FIG. 5 as the dimension placement plane P1 in accordance with an operation received from the operator through the operation receiver 13. The operator operates the operation receiver 13 to indicate any plane in the 3D space as the dimension placement plane P1. More specifically, the plane parallel to the direction of the dimension to be created is indicated as the dimension placement plane P1 to place the dimension at an easily-visible position. The placement plane indicator 110 is implemented by the controller 11 operating in cooperation with the operation receiver 13. The placement plane indicator 110 functions as placement-plane indication means.

Referring back to FIG. 4, the element selector 120 selects two target elements from the elements of the 3D model. The two target elements are herein used to create a target dimension and define the two ends of the dimension.

For example, with the display 14 displaying the 3D model M1, the operator operates the operation receiver 13, and clicks intended two of the vertices, edges, and faces of the multiple elements included in the 3D model M1. The element selector 120 selects the two target elements in accordance with the operation received from the operator through the operation receiver 13. The element selector 120 is implemented by the controller 11 operating in cooperation with the operation receiver 13. The element selector 120 functions as element selection means.

Figure 6:
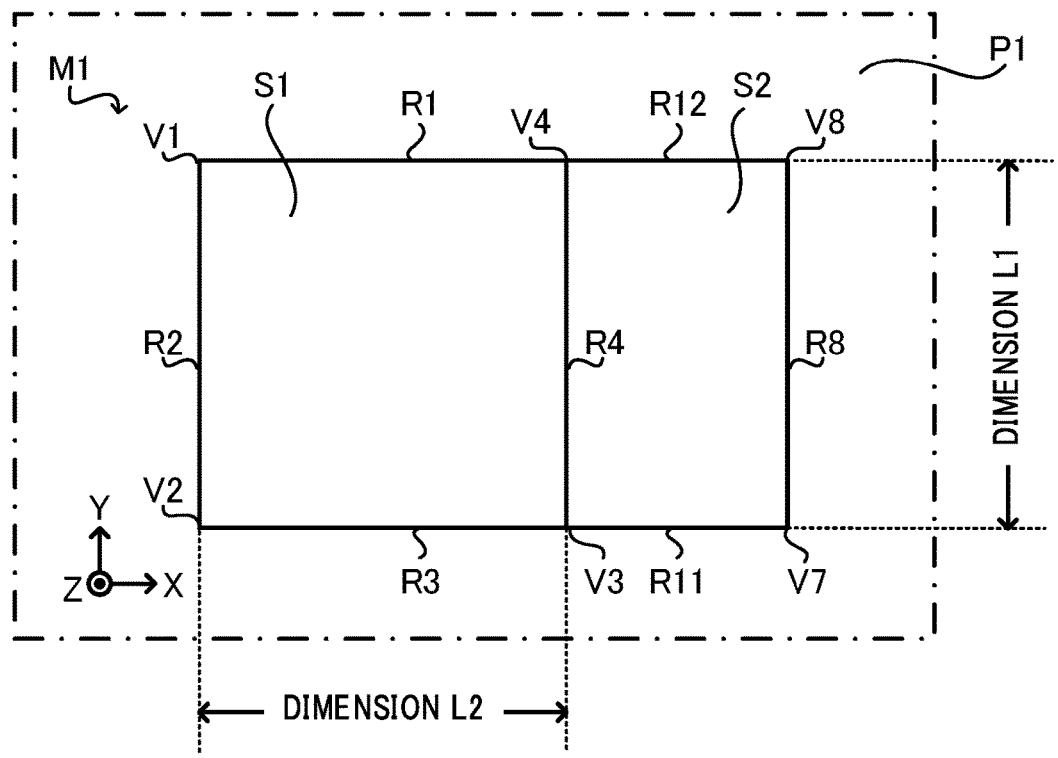
FIG. 6 is a diagram of the 3D model displayed with the direction of the dimension placement plane aligned with the direction of a screen in Embodiment 1.

More specifically, when selecting the two target elements, the operator operates the operation receiver 13 to change the orientation of the 3D model M1 displayed on the display 14 to align with the orientations of the screen and the dimension placement plane P1 indicated by the placement plane indicator 110. More specifically, as shown in FIG. 6, the operator rotates the 3D model M1 displayed on the display 14 to align the orientation of the dimension placement plane P1 with the orientation of the screen. Thus, the 3D model M1 is viewed in the Z-direction that is orthogonal to the dimension placement plane P1.

This adjustment of the orientation of the 3D model M1 enables creation of the dimensions for the 3D model M1 with the same operability as for creating the dimensions for a 2D drawing. Thus, the operator can easily select two target elements at the two ends of a target dimension.

However, such an operation of changing the orientation of the 3D model M1 may not be performed. Two target elements can be selected by selecting individual elements while, for example, the 3D model M1 is being rotated, without the orientation of the dimension placement plane P1 being aligned with the orientation of the screen.

In the example described below, two dimensions including a dimension L1 corresponding to the length of the edges R2, R4, R6, and R8, and a dimension L2 corresponding to the length of the edges R1 and R3 are created.

To create the dimension L1, the element selector 120 selects, in accordance with the operation of the operator, target elements from vertices, edges, or faces at the two ends of the dimension L1. For example, the element selector 120 selects edges R1 and R3 indicated with bold lines in FIG. 7 as target elements. In another example, the element selector 120 selects, for example, vertices V1 and V3 indicated with large dots in FIG. 8 as target elements.

To create the dimension L2, the element selector 120 selects, in accordance with the operation of the operator, target elements from vertices, edges, or faces located at the two ends of the dimension L2. For example, the element selector 120 selects edges R2 and R4 indicated with bold lines in FIG. 9 as target elements. In another example, the element selector 120 selects, for example, the vertices V1 and V3 indicated with large dots in FIG. 8 as target elements.

Referring back to FIG. 4, the direction indicator 130 indicates the direction of the target dimension. The operator operates the operation receiver 13 to indicate any direction in a 3D coordinate system including the X-direction, the Y-direction, and the Z-direction. For example, to create the dimension L1, the direction of the dimension L1 corresponds to the Y-direction, and thus the operator indicates the Y-direction in the 3D coordinate system. In another example, to create the dimension L2, the direction of the dimension L2 corresponds to the X-direction, and thus the operator indicates the X-direction in the 3D coordinate system.

As described above, the direction indicator 130 indicates the direction of the dimension in accordance with the operation received from the operator through the operation receiver 13. The direction indicator 130 is implemented by the controller 11 operating in cooperation with the operation receiver 13. The direction indicator 130 functions as direction indication means.

In addition to the direction of the dimension, the direction indicator 130 also indicates the position at which the dimension is placed. The operator operates the operation receiver 13 and clicks an intended position in the dimension placement plane P1 indicated by the placement plane indicator 110 to indicate the position at which the dimension is placed. The direction indicator 130 thus indicates a position at which the dimension created by the dimension creation device 10 is placed in accordance with the operation received from the operator through the operation receiver 13.

The dimension creator 140 creates the dimension between the two target elements selected by the element selector 120 in the direction indicated by the direction indicator 130. More specifically, the dimension creator 140 determines whether the 3D model M1 includes a first orthogonal face and a second orthogonal face when the element selector 120 selects vertices or edges as a first target element and a second target element. The first orthogonal face includes the selected first target element, and is orthogonal to the direction indicated by the direction indicator 130. The second orthogonal face includes the selected second target element, and is orthogonal to the direction indicated by the direction indicator 130. When the 3D model M1 is determined to include both the first orthogonal face and the second orthogonal face, the dimension creator 140 creates the dimension between the first orthogonal face and the second orthogonal face in the direction indicated by the direction indicator 130 in a manner associated with the first orthogonal face and the second orthogonal face.

When the dimension is indicated in a drawing, the target elements indicated by the dimension are normally expected to be faces, edges, or vertices with a higher likelihood in the stated order. Thus, the dimension is associated with faces irrespective of vertices or edges selected as the target elements. More specifically, when, for example, a target element of any dimension can be expected to be either a face or an edge, the indication of the dimension is expected to be an indication of the face. For example, when the dimension L1 in FIG. 6 is indicated, the indication can be expected to be an indication of a distance between two parallel faces that are the faces S5 and S6, a distance between the edges R1 and R3, or a distance between the edges R5 and R7. In this case, the expectation to be faces is more likely, and thus the indication is expected to be the distance between the faces S5 and S6. The distance between the edges R1 and R3 and the distance between the edges R5 and R7 are the same as the distance between the faces S5 and S6, and thus can be uniquely determined when the distance between the faces S5 and S6 is determined.

In an inspection process, the distance between the faces S5 and S6 is measured in accordance with the above expectation. Unless indicated otherwise, the distance between the edges R1 and R3 and the distance between the edges R5 and R7 are not measured. For example, irrespective of the edges R1 and R3 selected as the target elements to create the dimension L1, the element that is to be indicated by a designer is the distance between the faces S5 and S6, and the elements that are to be measured for the dimension L1 in the inspection process are the faces S5 and S6. When elements to be associated with the indicated dimension is unchanged from the edges R1 and R3 selected as the target elements without the faces S5 and S6 being associated with the dimension, the intended faces S5 and S6 are not measured in a measurement program created with the dimensional information read by software with CAT. Thus, the faces S5 and S6 are associated with the dimension irrespective of the edges R1 and R3 being selected.

As described above, irrespective of vertices or edges selected as target elements, any faces that can be allocated as target elements of the dimension are to be determined as target elements. Thus, when faces have the selected vertices or edges and are orthogonal to the direction of the dimension, the dimension creator 140 associates the dimension with the faces, instead of the selected vertices or edges.

More specifically, the dimension creator 140 creates the dimension associated with the association elements with the association-element determiner 141 and the associator 142.

The association-element determiner 141 determines two association elements based on the two target elements selected by the element selector 120 and the direction indicated by the direction indicator 130. The association elements are elements associated with the target dimension among the elements of the 3D model M1. The association-element determiner 141 determines the elements appropriate for defining the target dimension among faces, edges, and vertices in the elements of the 3D model M1 as the association elements. The association-element determiner 141 functions as association-element determination means.

(1) In a first case described below, the element selector 120 selects edges as two target elements.

When the element selector 120 selects an edge as the first target element, the association-element determiner 141 determines whether the 3D model M1 includes a first orthogonal face including the edge selected by the element selector 120 and orthogonal to the direction indicated by the direction indicator 130. Similarly, when the element selector 120 selects an edge as the second target element, the association-element determiner 141 determines whether the 3D model M1 includes a second orthogonal face including the edge selected by the element selector 120 and orthogonal to the direction indicated by the direction indicator 130.

Figure 7:
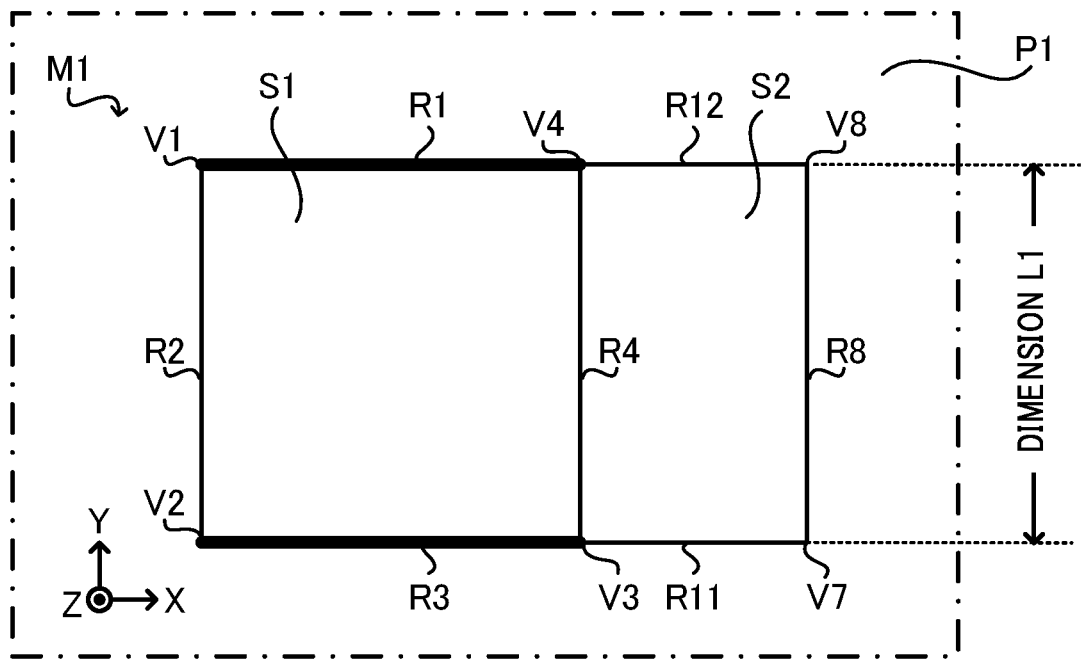
FIG. 7 is a diagram of the 3D model with two edges of the 3D model being selected to create a dimension in the Y-direction in Embodiment 1.

For example, to create the dimension L1 as shown in FIG. 7, the edge R1 may be selected as the first target element, and the edge R3 may be selected as the second target element. In this case, the faces including the edge R1 among the six faces S1 to S6 of the 3D model are the faces S1 and S5 colored in FIG. 10. Of the faces S1 and S5, the face orthogonal to the Y-direction that is the direction of the dimension L1 is the face S5. Thus, the association-element determiner 141 determines that the 3D model M1 has the face S5 as the first orthogonal face.

Figure 10:
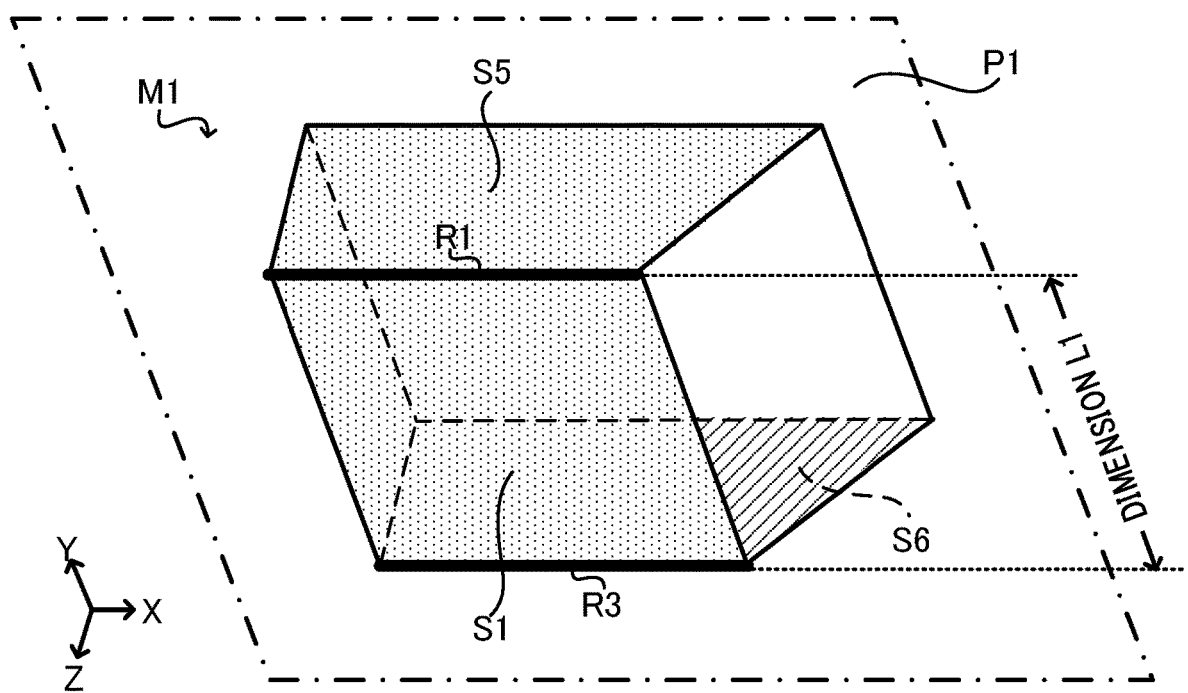
FIG. 10 is a diagram of a first example face including the edges selected as target elements in Embodiment 1.

The faces including the edge R3 among the six faces S1 to S6 of the 3D model are the face S6 hatched in FIG. 10 and the face S1. Of the faces S1 and S6, the face orthogonal to the Y-direction that is the direction of the dimension L1 is the face S6. Thus, the association-element determiner 141 determines that the 3D model M1 has the face S6 as the second orthogonal face.

Figure 11:
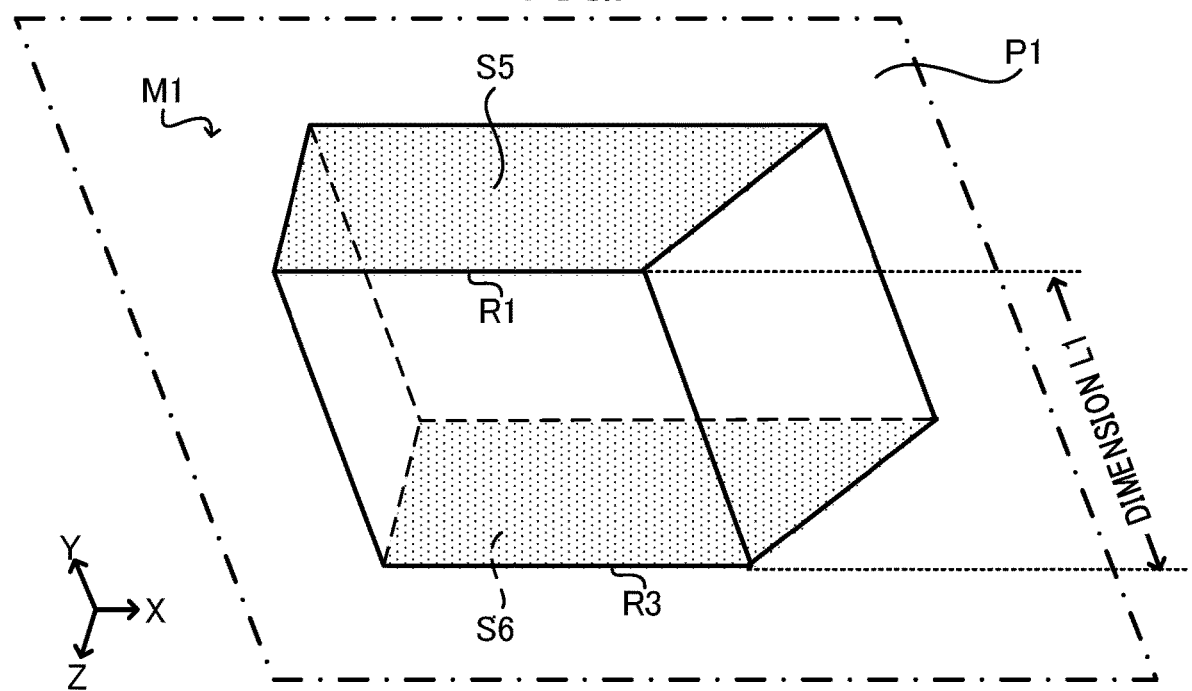
FIG. 11 is a diagram of example two faces determined as association elements in Embodiment 1.

When the 3D model M1 is determined as including the face S5 as the first orthogonal face, the association-element determiner 141 determines the face S5 as a first association element. Similarly, when the 3D model M1 is determined as including the face S6 as the second orthogonal face, the association-element determiner 141 determines the face S6 as the second association element. Thus, the association-element determiner 141 determines the face S5 colored in FIG. 11 as the first association element and the face S6 colored in FIG. 11 as the second association element.

In contrast, when none of the faces including the edge selected by the element selector 120 are orthogonal to the direction of the dimension, no face is appropriate for defining the target dimension. In other words, when no face is orthogonal to the direction of the dimension, the dimension is not expected to be a distance indicated for the faces. Thus, when the 3D model M1 does not include the first orthogonal face, the association-element determiner 141 determines the edge serving as the first target element and selected by the element selector 120 as the first association element. Similarly, when the 3D model M1 does not include the second orthogonal face, the association-element determiner 141 determines the edge serving as the second target element and selected by the element selector 120 as the second association element.

Figure 9:
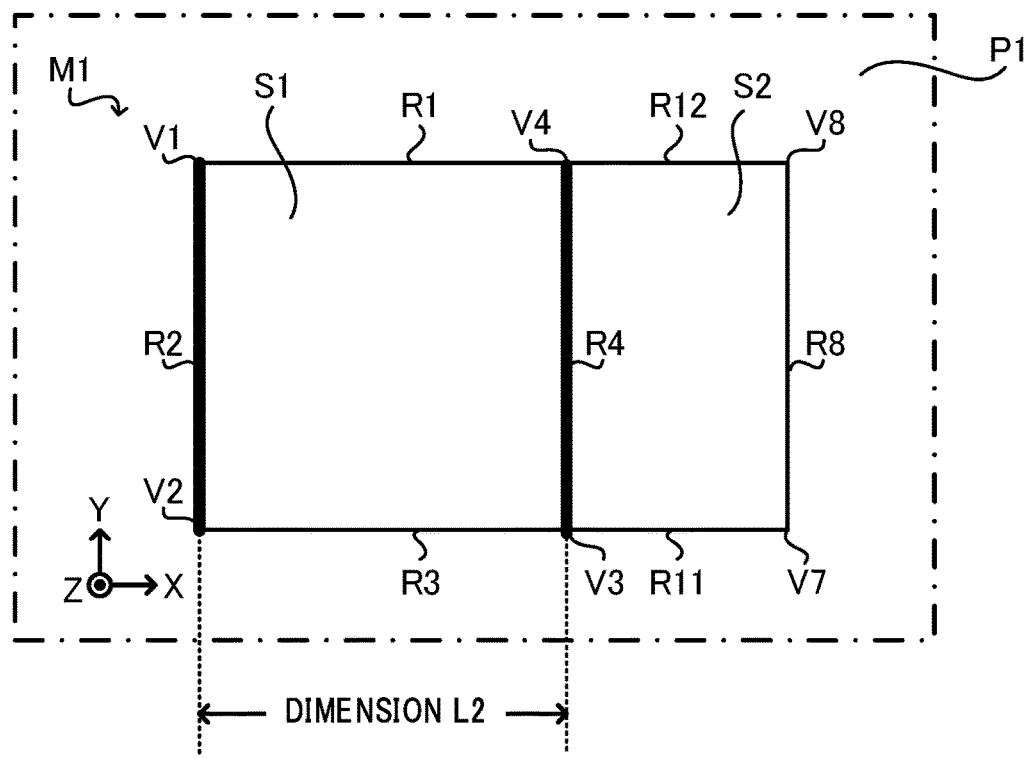
FIG. 9 is a diagram of the 3D model with two edges of the 3D model being selected to create a dimension in the X-direction in Embodiment 1.

For example, to create the dimension L2 as shown in FIG. 9, the edge R2 may be selected as the first target element, and the edge R4 may be selected as the second target element. In this case, the faces including the edge R2 among the six faces S1 to S6 of the 3D model are the faces S1 and S4 colored in FIG. 12. Of the faces S1 and S4, the face that is orthogonal to the X-direction that is the direction of the dimension L2 is the face S4. Thus, the association-element determiner 141 determines that the 3D model M1 has the face S4 as the first orthogonal face, and determines the face S4 as the first association element.

Figure 12:
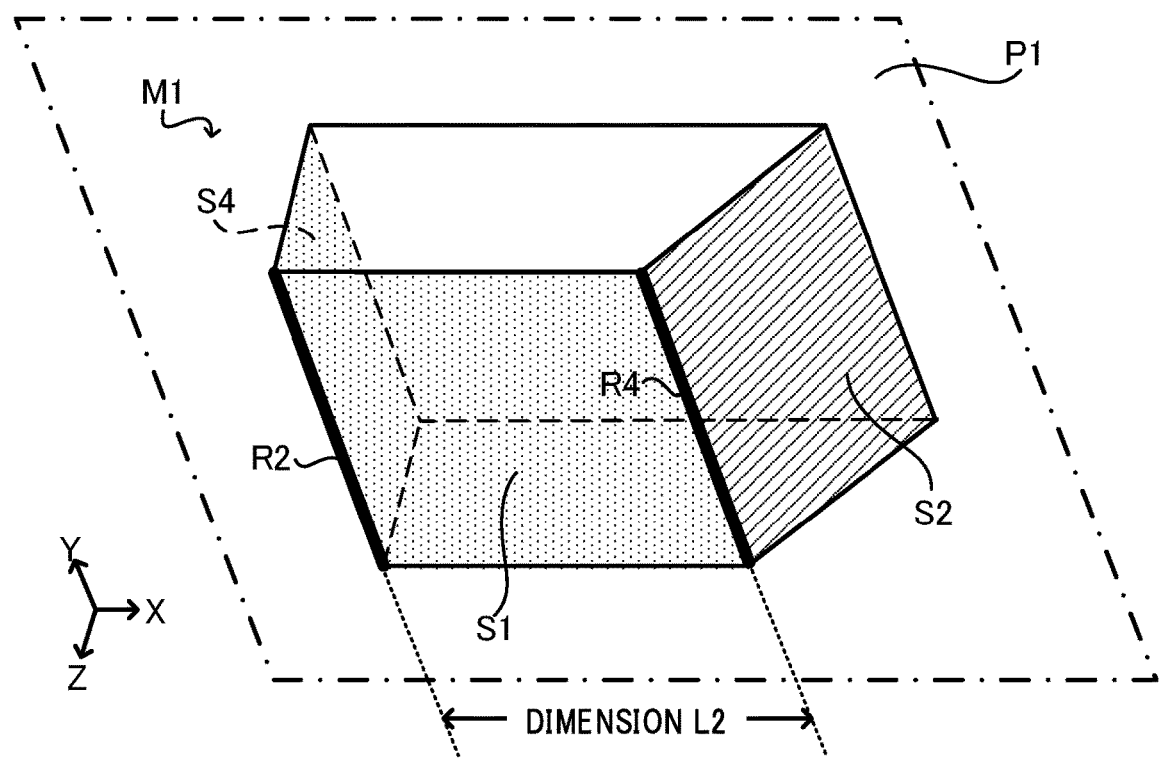
FIG. 12 is a diagram of a second example face including edges selected as target elements in Embodiment 1.

The faces including the edge R4 among the six faces S1 to S6 of the 3D model are the face S2 hatched in FIG. 12 and the face S1. The faces S1 and S2 are not orthogonal to the X-direction that is the direction of the dimension L2. Thus, the association-element determiner 141 determines that the 3D model M1 does not include the second orthogonal face.

When the 3D model M1 is determined as not including the second orthogonal face, the association-element determiner 141 determines the edge R4 selected as the second target element as the second association element instead of a face. Thus, the association-element determiner 141 determines the face S4 colored in FIG. 13 as the first association element and the edge R4 indicated with a bold solid line as the second association element.

(2) In a second case described below, the element selector 120 selects vertices as two target elements.

When the element selector 120 selects a vertex as the first target element, the association-element determiner 141 determines whether the 3D model M1 includes a first orthogonal edge including the vertex selected by the element selector 120 and orthogonal to the direction indicated by the direction indicator 130. Similarly, when the element selector 120 selects a vertex as the second target element, the association-element determiner 141 determines whether the 3D model M1 includes a second orthogonal edge including the vertex selected by the element selector 120 and orthogonal to the direction indicated by the direction indicator 130.

Figure 8:
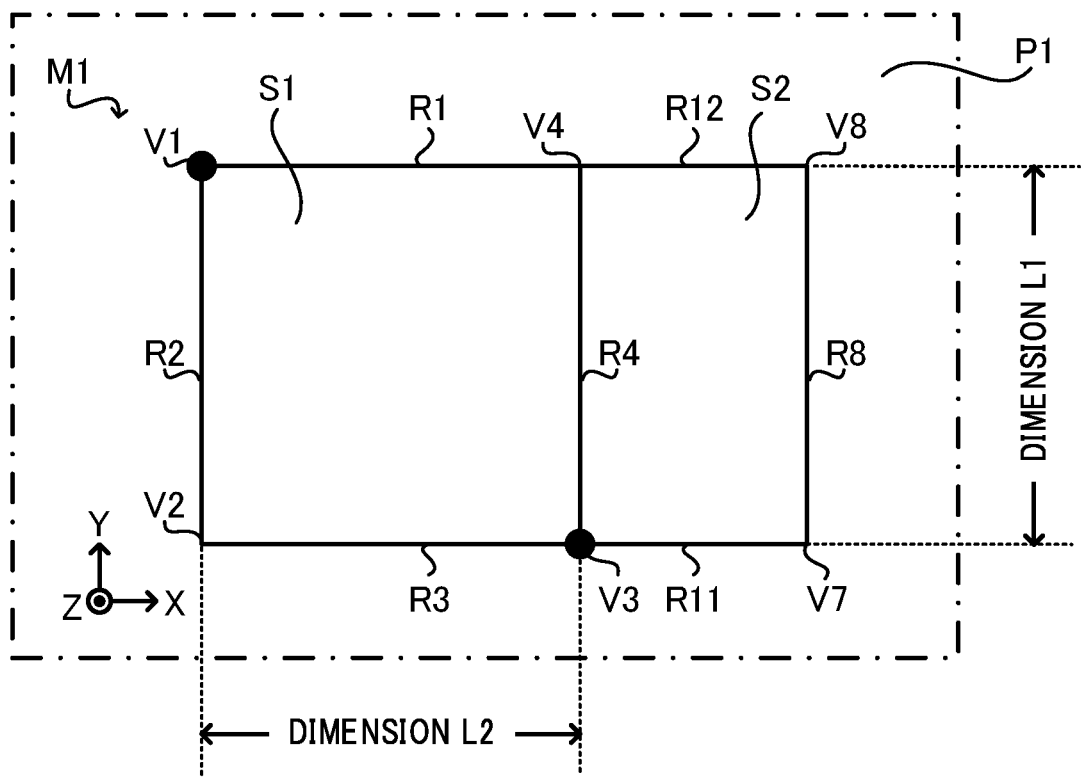
FIG. 8 is a diagram of the 3D model with two vertices of the 3D model being selected to create a dimension in the X-direction or the Y-direction in Embodiment 1.

More specifically, to create the dimension L2 as shown in FIG. 8, the vertex V1 may be selected as the first target element, and the vertex V3 may be selected as the second target element. In this case, the edges including the vertex V1 among the twelve edges R1 to R12 of the 3D model are the edges R1, R2, and R9 indicated with bold solid lines in FIG. 14. Of the edges R1, R2, and R9, the edges orthogonal to the X-direction that is the direction of the dimension L2 are the edges R2 and R9. Thus, the association-element determiner 141 determines that the 3D model M1 includes the edges R2 and R9 as the first orthogonal edges.

Figure 14:
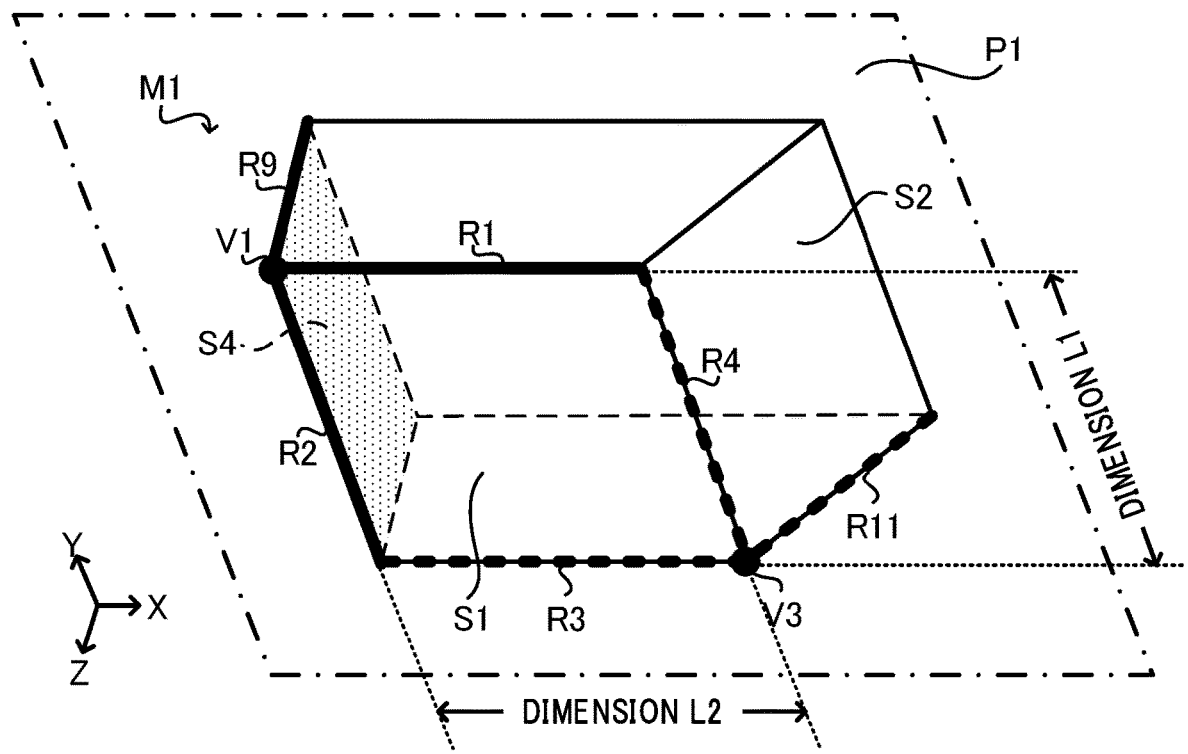
FIG. 14 is a diagram of example edges including vertices selected as target elements in Embodiment 1.

The edges including the vertex V3 among the twelve edges R1 to R12 of the 3D model are the edges R3, R4, and R11 indicated with bold broken lines in FIG. 14. Of the edges R3, R4, and R11, the edge orthogonal to the X-direction that is the direction of the dimension L2 is the edge R4. Thus, the association-element determiner 141 determines that the 3D model M1 includes the edge R4 as the second orthogonal edge.

When the 3D model M1 includes any first orthogonal edge, the association-element determiner 141 further determines whether the 3D model M1 includes the first orthogonal face including the first orthogonal edge and orthogonal to the direction indicated by the direction indicator 130. Similarly, when the 3D model M1 includes any second orthogonal edge, the association-element determiner 141 further determines whether the 3D model M1 includes the second orthogonal face including the second orthogonal edge and orthogonal to the direction indicated by the direction indicator 130.

In the example shown in FIG. 14, the face orthogonal to the direction of the dimension L2 among the faces including the edge R2 that is one of the first orthogonal edges is the face S4. In addition, the face orthogonal to the direction of the dimension L1 among the faces including the edge R9 that is another one of the first orthogonal edges is also the face S4. Thus, the association-element determiner 141 determines that the 3D model M1 has the face S4 as the first orthogonal face. When the 3D model M1 has the face S4 as the first orthogonal face, the association-element determiner 141 determines the face S4 as the first association element.

In contrast, the faces including the edge R4 that is one of the second orthogonal edges are the faces S1 and S2. None of these faces S1 and S2 are orthogonal to the direction of the dimension L2, indicating that no face is appropriate for defining the target dimension. When the 3D model M1 does not include the second orthogonal face, the association-element determiner 141 determines the edge R4 serving as the second orthogonal edge as the second association element.

Figure 13:
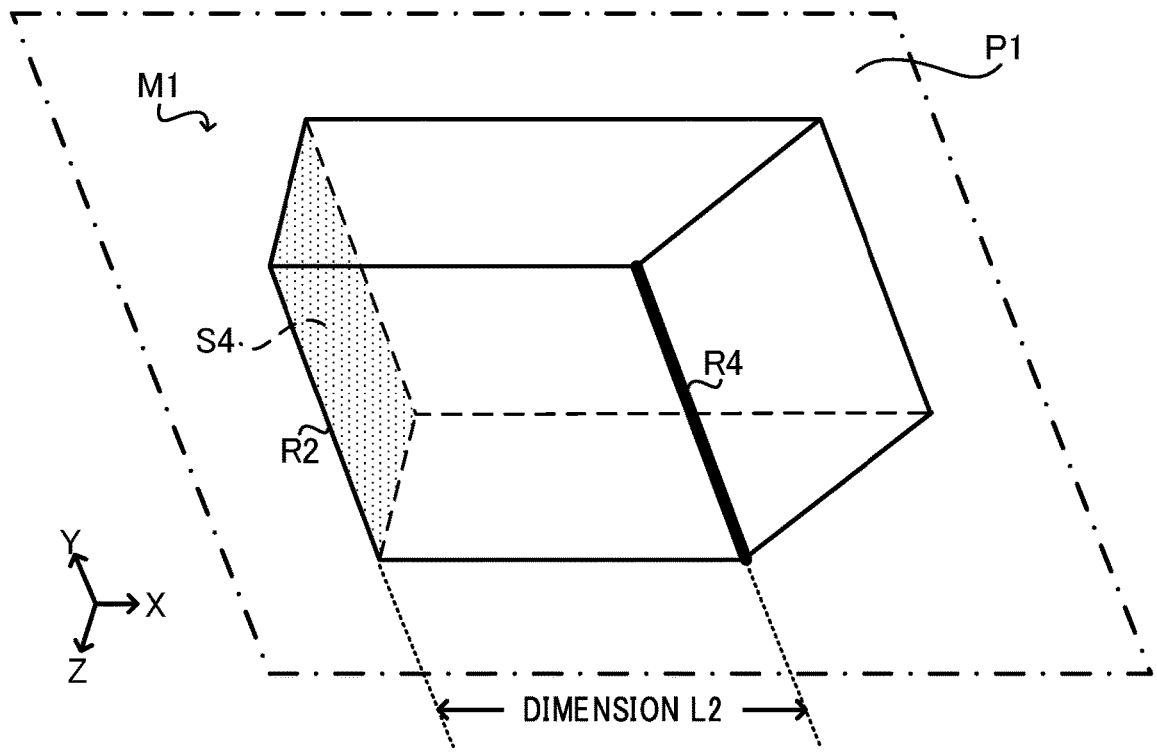
FIG. 13 is a diagram of an example face and an example edge determined as association elements in Embodiment 1.

When the vertices V1 and V3 are selected as the target elements to create the dimension L2, the association-element determiner 141 determines the face S4 colored in FIG. 13 and the edge R4 indicated with a bold solid line as the two association elements.

When none of the edges including the vertex selected by the element selector 120 are orthogonal to the direction of the dimension (not shown), no edge is appropriate for defining the target dimension. When the 3D model M1 does not include any first orthogonal edge, the association-element determiner 141 determines the vertex selected by the element selector 120 as the first association element. Similarly, when the 3D model M1 does not include any second orthogonal edge, the association-element determiner 141 determines the vertex selected by the element selector 120 as the second association element.

As described above, when the element selector 120 selects a vertex or an edge as the first target element and the 3D model M1 has a face including the first target element and orthogonal to the direction of the dimension indicated by the direction indicator 130, the association-element determiner 141 determines the face as the first association element. Similarly, when the element selector 120 selects a vertex or an edge as the second target element and the 3D model M1 has a face including the second target element and orthogonal to the direction of the dimension indicated by the direction indicator 130, the association-element determiner 141 determines the face as the second association element. In addition, when the 3D model M1 does not include the first orthogonal face and the second orthogonal face, the association-element determiner 141 further determines edges or vertices as the first association element and the second association element. Thus, the association-element determiner 141 automatically determines the association elements depending on the expectation of the target dimension to be the distance between faces, edges, or vertices.

In addition to a vertex or an edge, the element selector 120 can also select the first target element or the second target element from the multiple faces of the 3D model. In other words, the operator can directly select a face orthogonal to the direction of the dimension as at least one of the first target element or the second target element. When the element selector 120 selects a face orthogonal to the direction of the dimension as the first target element or the second target element, the association-element determiner 141 determines the selected face as the first association element or the second association element.

Referring back to FIG. 4, the associator 142 associates the target dimension with the first association element and the second association element determined by the association-element determiner 141. More specifically, the associator 142 associates the dimension L1 with the faces S5 and S6 to create the dimension L1. In another example, the associator 142 associates the dimension L2 with the face S4 and the edge R4 to create the dimension L2.

Thus, the associator 142 creates dimensional information indicating a target dimension and two association elements associated with the dimension. The created dimensional information defines that the dimension between two target elements selected by the element selector 120 is the dimension between the two association elements determined by the association-element determiner 141. The associator 142 functions as association means.

In the manner described above, the dimension creator 140 creates the dimension associated with the two association elements determined by the association-element determiner 141 as the dimension between the two target elements selected by the element selector 120 in the direction indicated by the direction indicator 130. The dimension creator 140 creates the dimension associated with the two association elements at the position indicated by the direction indicator 130 in the dimension placement plane P1 indicated by the placement plane indicator 110. The dimension creator 140 is implemented by the controller 11. The dimension creator 140 functions as dimension creation means.

Referring back to FIG. 4, the output device 150 outputs, outside the dimension creation device 10, the dimensional information indicating the dimension created by the dimension creator 140. For example, the output device 150 causes the display 14 to display the 3D model M1 annotated with the dimension created by the dimension creator 140. As shown in, for example, FIG. 11 or FIG. 13, the output device 150 causes the two association elements associated with the dimension L1 or L2 to appear in an emphasized manner to be visible for the operator.

In another example, the output device 150 outputs, to an external device through the communicator 15, output information indicating the 3D model M1 annotated with the dimension created by the dimension creator 140 and indicating the two association elements associated with the dimension. The external device is a device for, for example, processing or measuring a product based on the dimensional information created by the dimension creation device 10. The output device 150 is implemented by the controller 11 operating in cooperation with the display 14 or the communicator 15. The output device 150 functions as output means.

Figure 15:
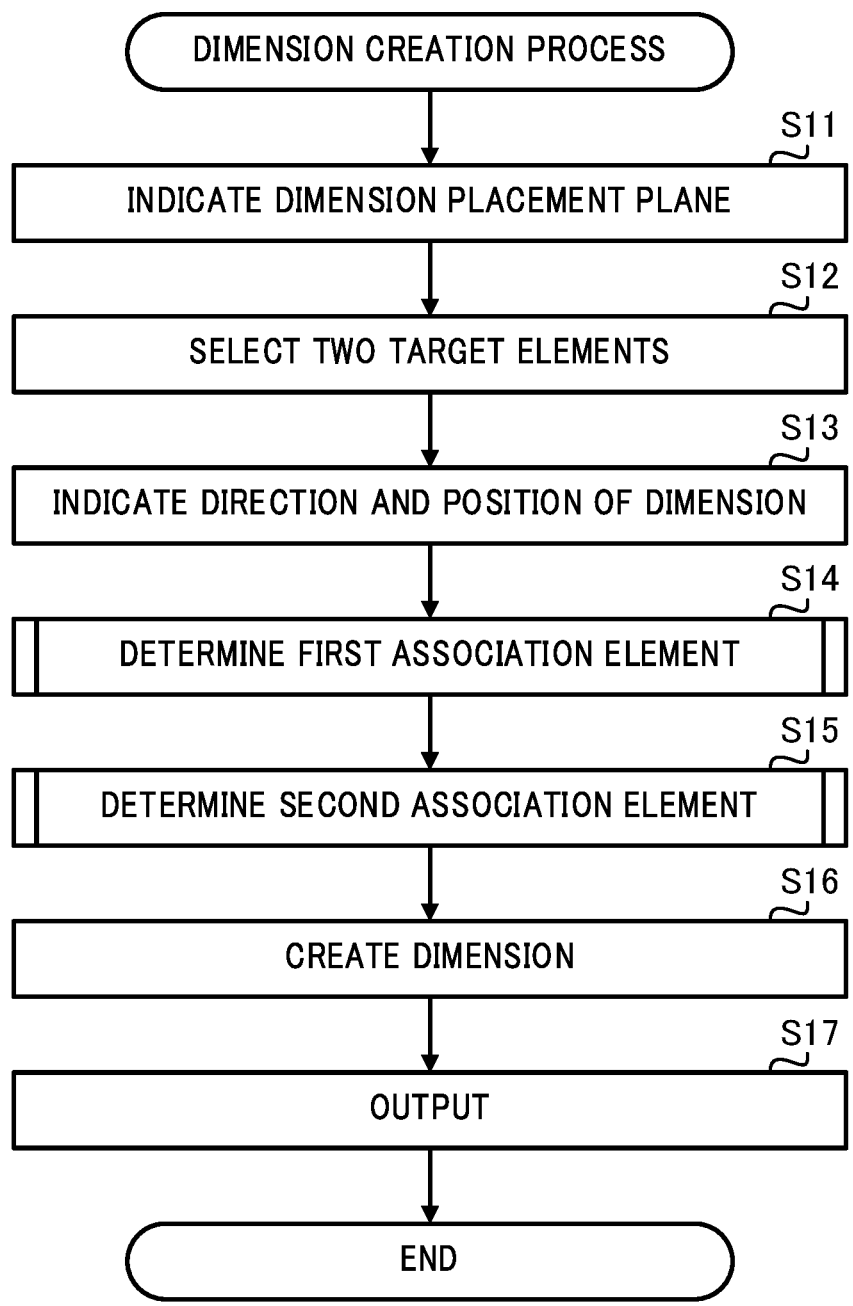
FIG. 15 is a flowchart of a dimension creation process performed by the dimension creation device according to Embodiment 1.

With reference to FIG. 15, the procedure of a dimension creation process performed by the dimension creation device 10 will be described. The dimension creation process shown in FIG. 15 is started after the 3D model M1 for which a dimension is created is read by the dimension creation device 10, and the 3D model M1 is displayed on the display 14.

When the dimension creation process is started, the controller 11 first functions as the placement plane indicator 110, and indicates the dimension placement plane P1 (step S11). More specifically, the controller 11 receives the operation of the operator through the operation receiver 13, and indicates, for example, the dimension placement plane P1 shown in FIG. 5 in accordance with the received operation.

The controller 11 then functions as the element selector 120, and selects two target elements for creating the dimension (step S12). More specifically, the controller 11 receives the operation of the operator through the operation receiver 13, and selects vertices or edges at the two ends of the target dimension in accordance with the received operation.

The controller 11 then functions as the direction indicator 130 and indicates the direction and the position of the dimension (step S13). More specifically, the controller 11 receives an operation of the operator through the operation receiver 13. The controller 11 indicates an appropriate direction in the 3D space as the direction of the target dimension in accordance with the operation received from the operator, and indicates an appropriate position in the dimension placement plane P1 as a position at which the target dimension is placed.

After indicating or selecting the dimension placement plane P1, the two target elements, and the direction and the position of the dimension, the controller 11 functions as the association-element determiner 141 and determines the first association element corresponding to the first target element of the two target elements selected in step S12 (step S14). The details of the process in step S14 will be described with reference to the flowchart shown in FIG. 16.

Figure 16:
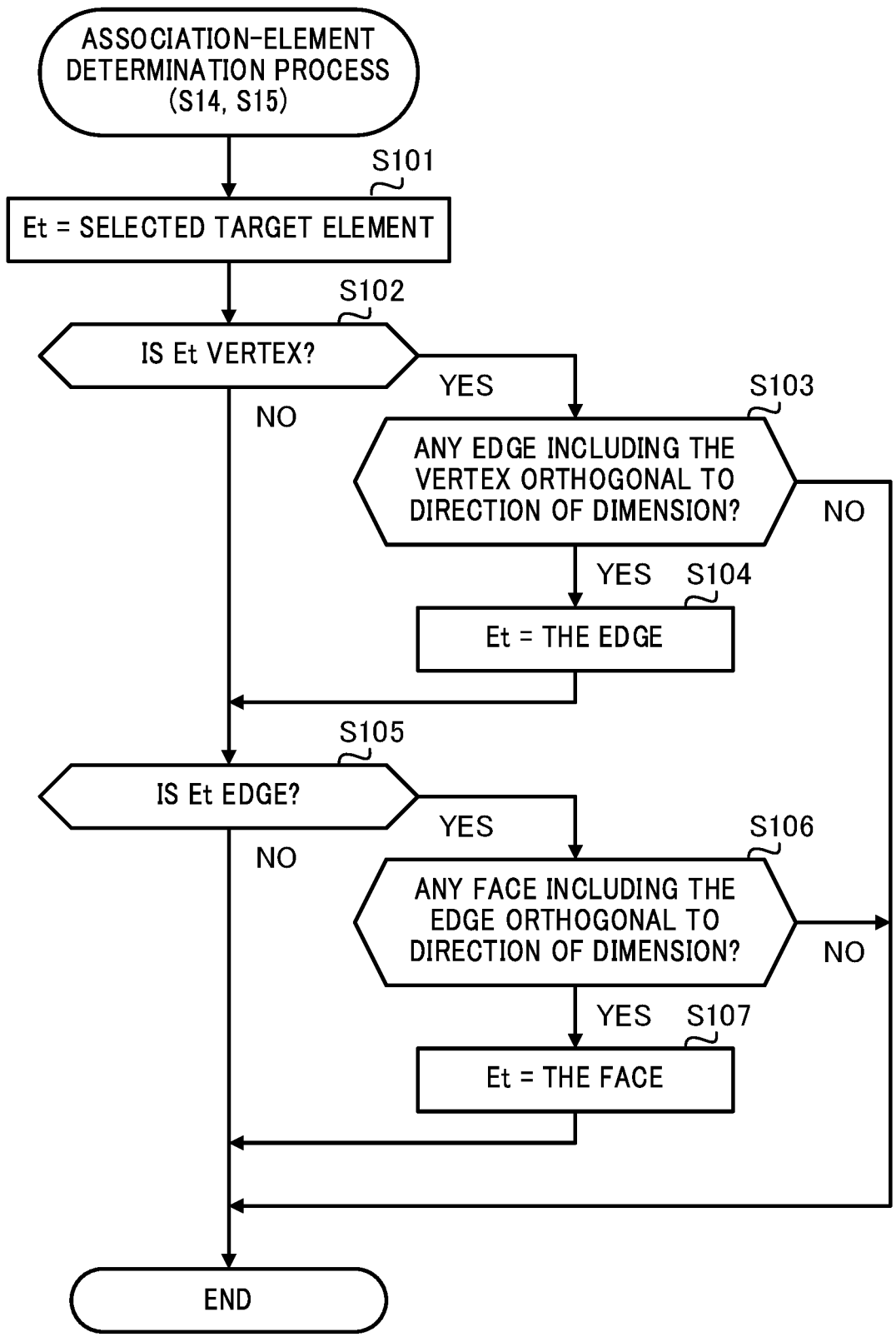
FIG. 16 is a flowchart of an association-element determination process performed by the dimension creation device according to Embodiment 1.

Upon starting an association-element determination process shown in FIG. 16, the controller 11 sets a variable Et indicating the first association element to the first target element selected in step S12 (step S101).

After setting the variable Et, the controller 11 determines whether the variable Et is a vertex (step S102). In other words, the controller 11 determines whether the first target element selected in step S12 is a vertex.

When the variable Et is a vertex (YES in step S102), the controller 11 determines whether any edge including the vertex is orthogonal to the direction of the dimension indicated in step S13 (step S103). In other words, when the first target element selected in step S12 is a vertex, the controller 11 determines whether the 3D model M1 includes at least one first orthogonal edge including the selected vertex and orthogonal to the direction of the indicated dimension.

When the first orthogonal edge is included (YES in step S103), the controller 11 sets the variable Et to the edge (step S104). When, for example, the first target element selected in step S12 is the vertex V1, the edges including the vertex V1 and orthogonal to the direction of the dimension are the edges R1 and R9. Thus, the controller 11 sets the variable Et to the edges R1 and R9.

In contrast, when the first orthogonal edge is not included (NO in step S103), the controller 11 ends the association-element determination process shown in FIG. 16. In this case, the variable Et indicating the first association element is set to the vertex selected in step S12. Thus, the controller 11 determines the vertex selected in step S12 as the first association element.

When the first target element selected in step S12 is not a vertex, or more specifically, when the first target element is an edge or a face, the controller 11 determines that the variable Et is not a vertex in step S102 (NO in step S102). In this case, the controller 11 skips the processes in steps S103 and S104.

When the variable Et is set to an edge in step S104 or when the variable Et is determined as not being a vertex in step S102, the controller 11 advances the processing to step S105. In step S105, the controller 11 determines whether the variable Et is an edge (step S105). When the variable Et is an edge, an edge is selected in step S12, or a vertex is selected in step S12 and any of the edges including the vertex is orthogonal to the direction of the dimension.

When the variable Et is an edge (YES in step S105), the controller 11 determines whether any of the faces including the edge is orthogonal to the direction of the dimension indicated in step S13 (step S106). In other words, when the first target element selected in step S12 is an edge or an edge is set to the variable Et in step S104, the controller 11 determines whether the 3D model M1 includes the first orthogonal face including the edge and orthogonal to the indicated direction.

When the first orthogonal face is included (YES in step S106), the controller 11 sets the variable Et to the face (step S107). When, for example, the first target element selected in step S12 is the edge R1, the face including the edge R1 and orthogonal to the direction of the dimension corresponds to the face S5. Thus, the controller 11 sets the variable Et to the face S5.

In another example, when the first target element selected in step S12 is the vertex V1 and the variable Et is set to the edges R2 and R9 in step S104, the face including the edge R2 and orthogonal to the direction of the dimension and the face including the edge R9 and orthogonal to the direction of the dimension each correspond to the face S5. Thus, the controller 11 sets the variable Et to the face S5.

In contrast, when the first orthogonal face is not included (NO in step S106), the controller 11 ends the association-element determination process shown in FIG. 16. In this case, the variable Et indicating the first association element is set to the edge selected in step S12 or set in step S104. Thus, the controller 11 determines the edge as the first association element.

When the first target element selected in step S12 is a vertex, and none of the edges including the vertex are orthogonal to the direction of the dimension, the controller 11 determines that the variable Et is not an edge in step S105 (NO in step S105). In another example, when the first target element selected in step S12 is neither a vertex nor an edge, or more specifically, when the first target element is a face, the controller 11 determines that the variable Et is not an edge in step S105. In these cases, the controller 11 skips the processes in steps S106 and S107. The association-element determination process in step S14 then ends.

Referring back to FIG. 15, after determining the first association element corresponding to the first target element, the controller 11 determines the second association element corresponding to the second target element of the two target elements selected in step S12 (step S15). The process in step S15 is the same as the process in step S14 described with reference to FIG. 16. More specifically, the process in step S15 can be similarly described by replacing the first target element in the process in step S14 with the second target element, the first association element with the second association element, the first orthogonal face with the second orthogonal face, and the first orthogonal edge with the second orthogonal edge.

After determining the two association elements corresponding to the two target elements in this manner, the controller 11 functions as the associator 142, and creates the dimension (step S16). More specifically, the controller 11 associates the dimension between the two association elements determined in steps S14 and S15 in the direction indicated in step S13 with these two association elements. Thus, the controller 11 creates dimensional information indicating the target dimension and the two association elements associated with the dimension.

After creating the dimension, the controller 11 functions as the output device 150, and outputs the created dimension (step S17). More specifically, the controller 11 causes the display 14 to display the 3D model M1 for which the dimension is created. In another example, the controller 11 generates output information indicating the 3D model M1 for which the dimension is created and the two association elements associated with the dimension, and outputs the generated information to an external device through the communicator 15. The dimension creation process shown in FIG. 15 then ends.

As described above, the dimension creation device 10 according to Embodiment 1 selects the first target element and the second target element from the elements of the 3D model M1, and indicates the direction of the target dimension. When vertices or edges are selected as the first target element and the second target element, and the 3D model M1 includes the first orthogonal face including the first target element and orthogonal to the direction of the dimension and the second orthogonal face including the second target element and orthogonal to the direction of the dimension, the dimension creation device 10 according to Embodiment 1 creates the dimension between the first orthogonal face and the second orthogonal face in the indicated direction in a manner associated with the first orthogonal face and the second orthogonal face.

As described above, irrespective of the operator selecting a vertex or an edge, the dimension is created in a manner associated with any face to be associated with the dimension. The operator thus does not determine the element to be associated with the dimension. This allows efficient creation of a dimension correctly associated with an element of the 3D model M1 created efficiently. The dimension creation device 10 according to Embodiment 1 can create a dimension correctly readable with software such as CAM or CAT, and thus can enhance the design work efficiency using a 3D model.

A dimension associated with a face can be created irrespective of the operator selecting a vertex or an edge. Thus, the two faces at the two ends of the target dimension are not to be selected directly. This structure can reduce the operation of rotating the 3D model M1 to display a face not appearing at the front of the screen. This enables selection of elements of a 3D model with the same operability as in selecting elements of a 2D model, and can enhance the work efficiency of the operator.

Embodiment 2

Embodiment 2 will now be described. The same components and functions as in Embodiment 1 will not be described.

A dimension creation device 10 according to Embodiment 2 has functions of the placement plane indicator 110, the element selector 120, the direction indicator 130, the dimension creator 140, and the output device 150 described in Embodiment 1. The dimension creator 140 in Embodiment 2 has, in addition to the functions described in Embodiment 1, a function of determining whether the 3D model includes an element with the same dimension as the target dimension other than the two association elements determined by the association-element determiner 141.

Figure 17:
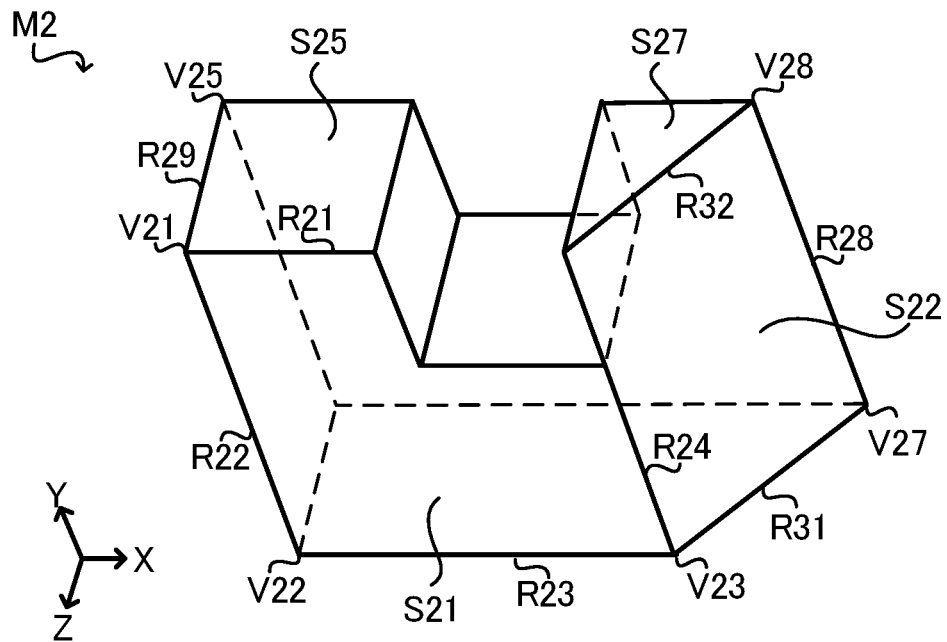
FIG. 17 is a diagram of an example 3D model for which dimensions are created with a dimension creation device according to Embodiment 2.

FIG. 17 shows a 3D model M2 for describing the functions of the dimension creation device 10 according to Embodiment 2. The 3D model M2 has the shape of the 3D model M1 described in Embodiment 1 with the face S5 partly being cutout. More specifically, the face S5 in the 3D model M1 is divided into faces S25 and S27 in the same plane in the 3D model M2. For simplicity, in FIG. 17 and the subsequent figures, some of the faces, the edges, and the vertices included in the 3D model M2 are not denoted with the reference signs.

In Embodiment 2, the association-element determiner 141 determines whether the 3D model M2 includes at least one element different from the first association element and the second association element in an imaginary plane including at least one of the first association element or the second association element and orthogonal to the direction of the dimension indicated by the direction indicator 130. When the 3D model M2 is determined as including the at least one element, the associator 142 further associates the target dimension with the at least one element in addition to the first association element and the second association element.

Figure 18:
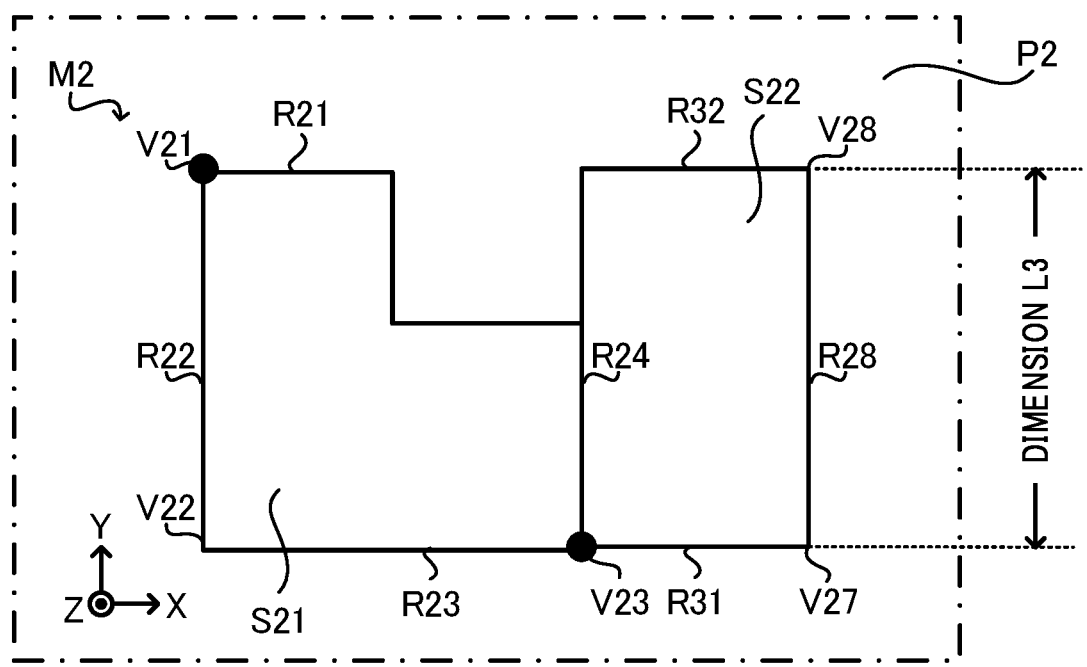
FIG. 18 is a diagram of the 3D model with two vertices of the 3D model being selected to create a dimension in the Y-direction in Embodiment 2.

In the example described below, as shown in FIG. 18, the element selector 120 selects vertices V21 and V23 as the two target elements to create a dimension L3 corresponding to the length of edge R22, R24, or R28 of the 3D model M2. FIG. 18 shows a dimension placement plane P2 indicated by the placement plane indicator 110 with a dot-and-dash line.

When the element selector 120 selects the vertex V21 as the first target element, the association-element determiner 141 determines the edge R21 including the vertex V21 and orthogonal to the direction of the dimension L3 as the first orthogonal edge. The association-element determiner 141 then determines the face S25 including the edge R21 serving as the first orthogonal edge and orthogonal to the direction of the dimension L3 as the first orthogonal face.

Similarly, when the element selector 120 selects the vertex V23 as the second target element, the association-element determiner 141 determines the edges R23 and R31 including the vertex V23 and orthogonal to the direction of the dimension L3 as the second orthogonal edges. The association-element determiner 141 then determines the face S26 including the edges R23 and R31 serving as the second orthogonal edges and orthogonal to the direction of the dimension L3 as the second orthogonal face.

Figure 19:
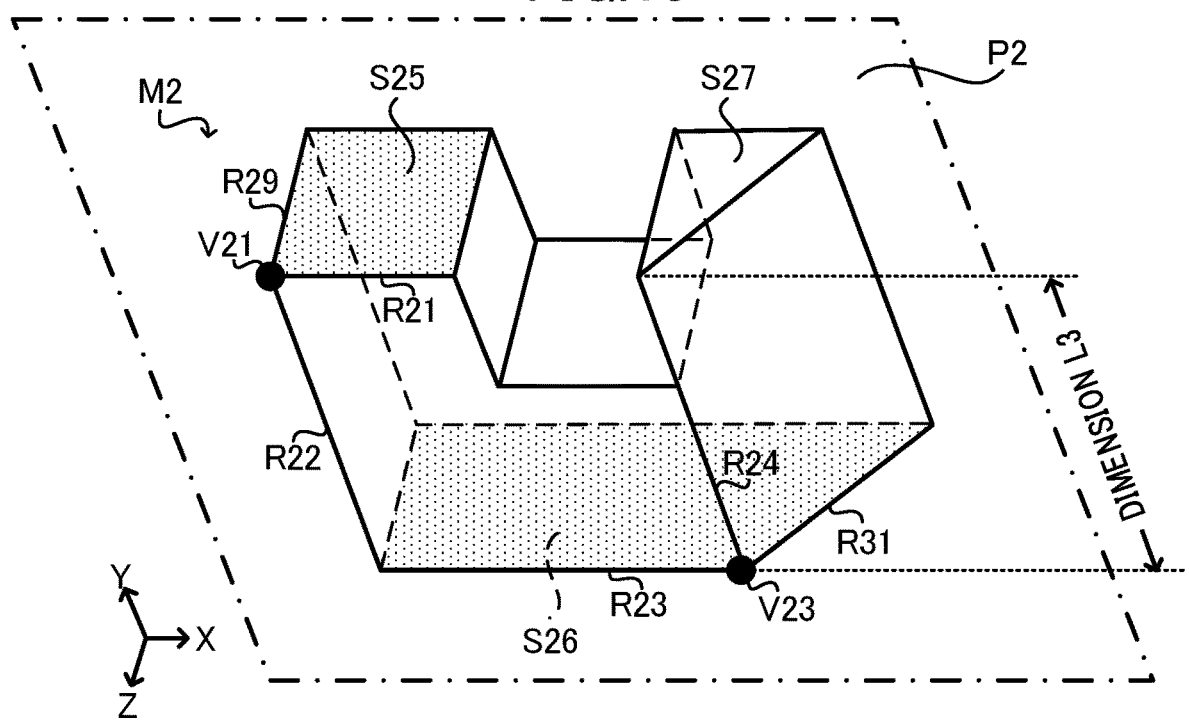
FIG. 19 is a diagram of example two faces determined as association elements in Embodiment 2.

Thus, the association-element determiner 141 determines the face S25 colored in FIG. 19 as the first association element and the face S26 colored in FIG. 19 as the second association element. The associator 142 associates the target dimension L3 with the faces S25 and S26 determined as the first and the second association elements by the association-element determiner 141.

In Embodiment 2, when the faces S25 and S26 are determined as the first and the second association elements in this manner, the association-element determiner 141 determines whether the 3D model M2 includes at least one face different from the faces S25 and S26 in an imaginary plane including at least one of the faces S25 and S26 and orthogonal to the direction of the dimension L3. In other words, the association-element determiner 141 determines whether at least one face different from the faces S25 and S26 is in the same plane as at least one of the faces S25 and S26. When the 3D model M2 includes at least one face different from the faces S25 and S26 in the same plane, the association-element determiner 141 determines the at least one face as an additional association element.

Figure 20:
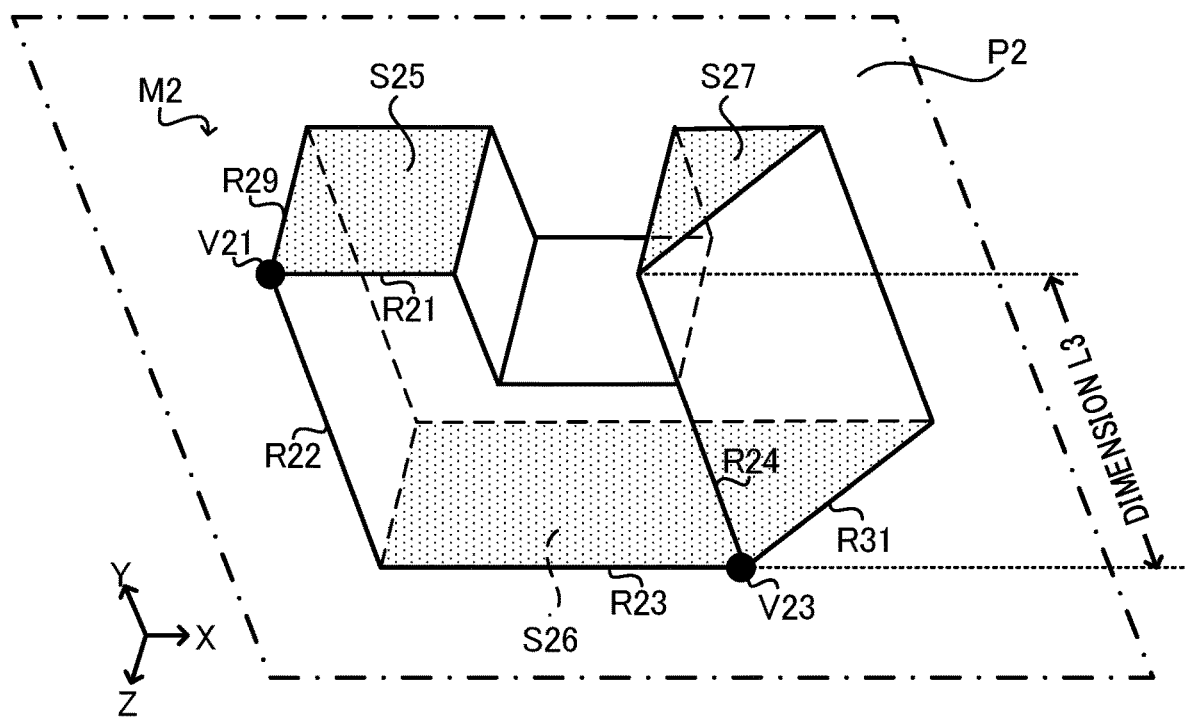
FIG. 20 is a diagram of another example face determined as an additional association element in Embodiment 2, in addition to the two faces shown in FIG. 19.

More specifically, the 3D model M2 includes a face S27 colored in FIG. 20 as another face in the same plane as the face S25 serving as the first orthogonal face. The faces S25 and S27 are in the same plane. Thus, the dimension between the faces S27 and S26 is the dimension L3 in the same manner as for the dimension between the faces S25 and S26. Thus, the association-element determiner 141 determines the face S27 as an additional association element.

In contrast, the 3D model M2 includes none of other faces, edges, and vertices in the same plane as the face S26 serving as the second orthogonal face. Thus, the association-element determiner 141 determines that the same plane as the face S26 includes no additional association element.

When the association-element determiner 141 determines the face S27 as the additional association element, the associator 142 further associates the target dimension L3 with the face S27 in addition to the faces S25 and S26. The dimension creator 140 thus creates the dimension associated with the three faces S25, S26, and S27. In other words, the dimension creator 140 creates the dimension L3 as the dimension between the faces S25 and S26 and between the faces S26 and S27. Thus, when the 3D model M2 is read with software such as CAM or CAT, in addition to the faces S25 and S26, the face S27 can be also acquired as a target element from the dimension L3. When, for example, the dimension L3 is selected in CAT, in addition to the faces S25 and S26, the face S27 can be also set as a face to be measured. To acquire dimensional information from faces, information about the dimension L3 can be acquired from the face S27 in addition to the faces S25 and S26.

Figure 21:
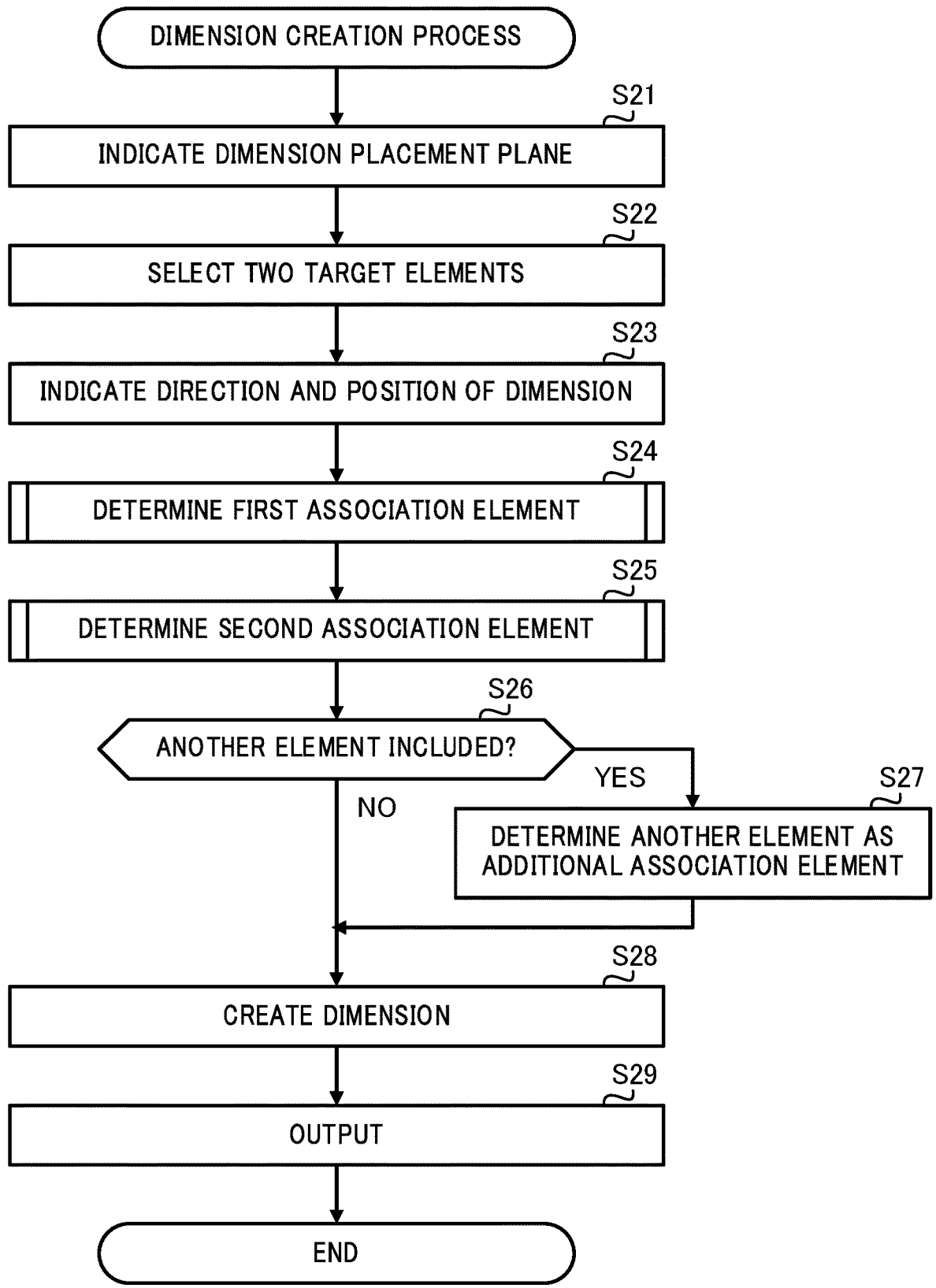
FIG. 21 is a flowchart of a dimension creation process performed by the dimension creation device according to Embodiment 2.

With reference to FIG. 21, the procedure of a dimension creation process performed by the dimension creation device 10 according to Embodiment 2 will now be described. The processes in steps S21 to S25 in the dimension creation process shown in FIG. 21 are the same as the processes in steps S11 to S15 in the dimension creation process shown in FIG. 15 in Embodiment 1, and thus will not be described.

The controller 11 performs the processes in steps S21 to S25 to determine the first association element and the second association element associated with the target dimension. After determining the first association element and the second association element, the controller 11 determines whether at least one element different from the first association element and the second association element is included as an element of the 3D model M2 in an imaginary plane including at least one of the first association element or the second association element and orthogonal to the direction of the dimension (step S26).

When the at least one element is included (YES in step S26), the controller 11 determines the at least one different element as an additional association element associated with the target dimension (step S27). When the at least one different element is not included (NO in step S26), the controller 11 skips the process in step S27.

After determining the association element as above, the controller 11 creates the dimension in a manner associated with the at least two association elements determined in steps S24, S25, and S27 (step S28). More specifically, when determining the additional association element in step S27, the controller 11 creates the dimension in a manner associated with the additional association element and the two association elements determined in steps S25 and 26. When the additional association element is not determined in step S27, the controller 11 creates the dimension in a manner associated with the two association elements determined in steps S25 and 26.

After creating the dimension, the controller 11 outputs the created dimension (step S29). The process in step S29 is the same as the process in step S17 in Embodiment 1. The dimension creation process shown in FIG. 21 then ends.

As described above, when the 3D model M2 includes at least one different element in an imaginary plane including at least one of the first association element or the second association element and orthogonal to the direction of the dimension, the dimension creation device 10 according to Embodiment 2 creates a dimension in a manner associated with the at least one different element in addition to the first association element and the second association element. Thus, another element with the same dimension as the target dimension is automatically detected and associated with the dimension. Thus, time and effort for creating dimensions for multiple elements can be reduced. The operator can efficiently add elements to be associated with the dimension.

In Embodiment 2, the first association element and the second association element are faces. However, the first association element or the second association element that are a vertex or an edge instead of a face can be similarly described. More specifically, when the first association element or the second association element is a vertex or an edge, the association-element determiner 141 determines whether the 3D model M2 includes at least one different element in an imaginary plane including the vertex or the edge and orthogonal to the direction of the dimension. When the 3D model M2 includes at least one different element, the associator 142 further associates the target dimension with the at least one different element in addition to the first association element and the second association element.

The at least one different element may be a vertex or an edge instead of a face. More specifically, when the 3D model M2 includes an edge without including a face as the at least one different element, the association-element determiner 141 determines the edge as the additional association element. When the 3D model M2 includes a vertex without including any face or any edge as the at least one different element, the association-element determiner 141 determines the vertex as the additional association element. Thus, irrespective of the different element with the same dimension the target dimension being a vertex or an edge, the operator can reduce time and effort taken to create the dimension.

Embodiment 3

Embodiment 3 will now be described. The same components and functions as in Embodiments 1 and 2 will not be described.

In Embodiments 1 and 2, the edge selected as the target element is a straight edge. In Embodiment 3 described below, a circular edge is included in elements of the 3D model and selected as a target element. In this case, instead of being a perfect circle, the circle may have a shape slightly different from a perfect circle such as an ellipse.

Figure 22:
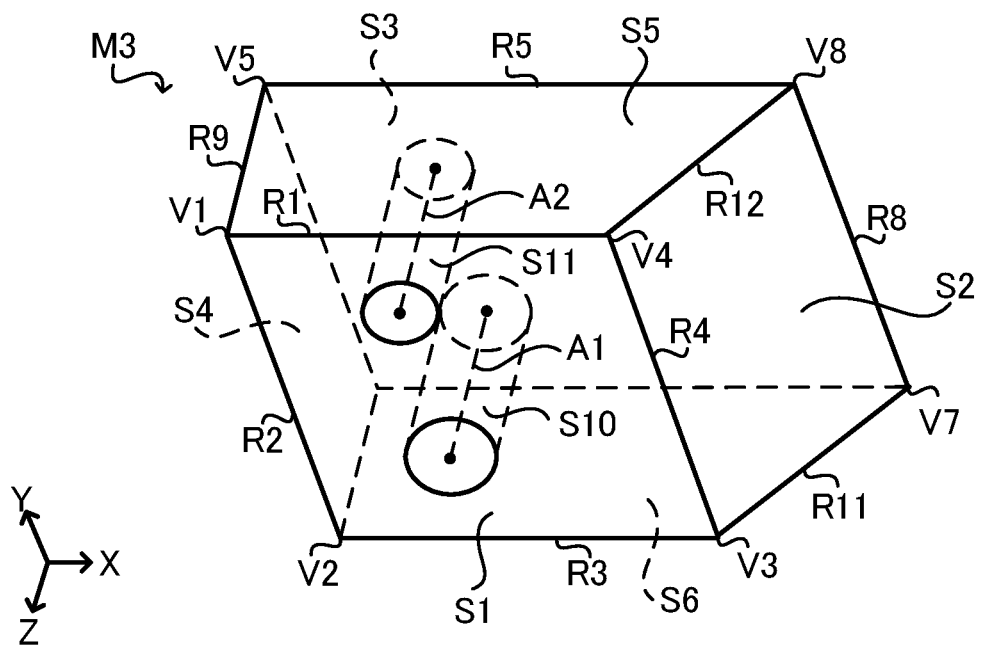
FIG. 22 is a diagram of an example 3D model for which dimensions are created with a dimension creation device according to Embodiment 3.
Figure 23:
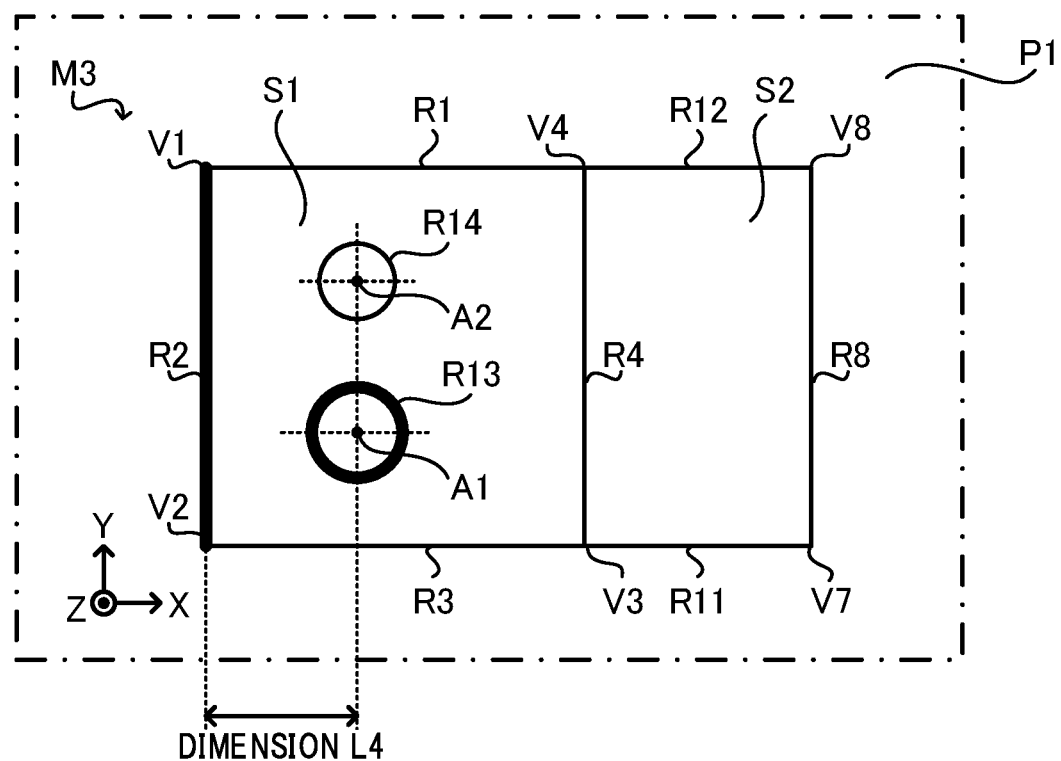
FIG. 23 is a diagram of the 3D model in FIG. 22 in a 2D plane.

FIG. 22 shows a 3D model M3 in Embodiment 3. FIG. 23 shows the shape of the 3D model M3 when viewed in the positive Z-direction in a 2D plane. As shown in FIGS. 22 and 23, as in the 3D model M1 described in Embodiment 1, the 3D model M3 includes six faces S1 to S6, twelve edges R1 to R12, and eight vertices V1 to V8 as elements. The 3D model M3 additionally has two cylindrical through-holes extending in the Z-direction. The 3D model M3 has two cylindrical faces S10 and S11 serving as the surfaces defining the two through-holes.

In the example described below, a dimension L4 is created for the 3D model M3. The dimension L4 corresponds to the distance between the face S4 and a cylinder axis A1 of the cylindrical face S10. To be distinguished from the cylindrical faces S10 and S11, the face S4 is referred to as a flat face S4 below.

The element selector 120 selects two target elements for creating the dimension L4 in accordance with the operation of the operator. More specifically, the element selector 120 selects the edge R2 as the first target element and the edge R13 as the second target element. The edge R2 is a straight edge included in the flat face S4. In contrast, the edge R13 is a circular edge included in the cylindrical face S10. The operator operates the operation receiver 13 to select, from the elements in the 3D model M3, the edges R2 and R13 as the two target elements for creating the dimension L4.

The direction indicator 130 indicates the X-direction as a direction of the dimension L4 in accordance with the operation of the operator. The direction indicator 130 also indicates, in accordance with the operation of the operator, a position in the dimension placement plane P1 at which the dimension L4 is placed.

When the straight edge R2 is selected as the first target element, the association-element determiner 141 determines the first association element by performing the same determination process as in Embodiment 1.

More specifically, the association-element determiner 141 determines whether the 3D model M3 includes a first orthogonal face including the edge R2 selected by the element selector 120 and orthogonal to the direction indicated by the direction indicator 130. The 3D model M3 includes the flat face S4 as the first orthogonal face, and thus the association-element determiner 141 determines the flat face S4 as the first association element.

In contrast, when the circular edge R13 is selected as the second target element, the association-element determiner 141 determines whether the 3D model M3 includes a second orthogonal cylindrical face including the circular edge R13 and a cylinder axis orthogonal to the direction indicated by the direction indicator 130.

In the 3D model M3, the circular edge R13 is one of the two circular edges included in the cylindrical face S10. The cylinder axis A1 of the cylindrical face S10 extends in the Z-direction and is orthogonal to the X-direction that is the direction of the dimension L4. Thus, the association-element determiner 141 determines that the 3D model M3 includes the cylindrical face S10 as the second orthogonal cylindrical face. When the circular edge R13 is selected as the second target element and the 3D model M3 includes a second orthogonal cylindrical face as above, the association-element determiner 141 determines the cylindrical face S10 serving as the second orthogonal cylindrical face as the second association element.

When the association-element determiner 141 determines the first association element and the second association element, the associator 142 associates the target dimension L4 with the flat face S4 serving as the first association element and determined by the association-element determiner 141 and with the cylindrical face S10 serving as the second association element. Thus, the dimension creator 140 creates the dimension L4 associated with the flat face S4 and the cylindrical face S10. The output device 150 outputs, outside the dimension creation device 10, dimensional information indicating the dimension L4 created by the dimension creator 140. The processes performed by the associator 142 and the output device 150 are the same as those in Embodiment 1, and will not be described in detail.

In contrast, when the element selector 120 selects a circular edge as the second target element, and the 3D model M3 does not include the second orthogonal cylindrical face (not shown), the association-element determiner 141 determines the circular edge selected as the second target element as the second association element. In other words, when none of the cylindrical faces included in the 3D model M3 include a circular edge selected as the second target element and a cylinder axis orthogonal to the direction indicated by the direction indicator 130, the 3D model M3 includes no face appropriate for defining the target dimension. In this case, the association-element determiner 141 determines a circular edge that is a second target element selected by the element selector 120 as the second association element.

Although the circular edge R13 is selected as the second target element in Embodiment 3, the process is similarly performed as when a circular edge is selected as the first target element. More specifically, the same process is performed for the first target element and the second target element. Thus, the process for the circular edge as the first target element can be described similarly for the second target element replaced with the first target element, the second orthogonal cylindrical face with the first orthogonal cylindrical face, and the second association element with the first association element in the example described above.

As described above, when a circular edge is selected as the target element, and the 3D model includes a cylindrical face including the circular edge and a cylinder axis orthogonal to the direction of the target dimension, the dimension creation device 10 according to Embodiment 3 creates the target dimension in a manner associated with the cylindrical face. Irrespective of a circular edge selected as the target element, the dimension creation device 10 according to Embodiment 3 creates the dimension in a manner associated with any cylindrical face appropriate for association with the dimension. Thus, the operator does not determine the element to be associated with the dimension. Thus, a dimension correctly associated with the element of the 3D model can be created efficiently.

Irrespective of a circular edge selected as a target element, the dimension associated with the cylindrical face can be created. Thus, the operator does not directly select the cylindrical face. This structure can reduce the operation of the operator rotating the 3D model to display a cylindrical face not displayed at the front of the screen. This enables selection of elements of a 3D model with the same operability as in selecting elements of a 2D model, and can thus enhance the work efficiency of the operator.

In Embodiment 3, when at least one of the first association element or the second association element is a cylindrical face, and an imaginary plane including the cylinder axis of the cylindrical face and orthogonal to the direction indicated by the direction indicator 130 includes the cylinder axis of at least one cylindrical face different from the first association element and the second association element, the dimension creator 140 creates a dimension by further associating the dimension with the at least one cylindrical face in addition to the first association element and the second association element.

More specifically, when the at least one of the first association element or the second association element is a cylindrical face, the association-element determiner 141 determines whether an imaginary plane including the cylinder axis of the cylindrical face and orthogonal to the direction of the dimension indicated by the direction indicator 130 includes the cylinder axis of a cylindrical face different from the first association element and the second association element. When the imaginary plane is determined as including the cylinder axis of the at least one cylindrical face, the associator 142 further associates the target dimension with the at least one cylindrical face in addition to the first association element and the second association element.

In the example described below, similarly to the above, the element selector 120 selects the flat face S4 as the first association element and the cylindrical face S10 as the second association element to create the dimension L4. In this case, an imaginary plane including a cylinder axis A1 of the cylindrical face S10 serving as the second association element and orthogonal to the X-direction that is the direction of the dimension L4 includes a cylinder axis A2 of a cylindrical face S11. Thus, the association-element determiner 141 determines the cylindrical face S11 as the additional association element.

When the association-element determiner 141 determines the cylindrical face S11 as the additional association element, the associator 142 further associates the target dimension L4 with the cylindrical face S11 in addition to the flat face S4 and the cylindrical face S10. The dimension creator 140 in this manner creates the dimension L4 associated with the flat face S4 and the cylindrical faces S10 and S11.

As described above, when the first association element or the second association element is a cylindrical face, and an imaginary plane including the cylinder axis of the cylindrical face and orthogonal to the direction of the target dimension includes the cylinder axis of a different cylindrical face, the dimension creation device 10 according to Embodiment 3 creates the dimension by further associating the dimension with the different cylindrical face. As described above, another element with the same dimension as the target dimension is automatically detected and associated with the dimension. Thus, time and effort for creating dimensions for multiple elements can be reduced. The operator can efficiently add elements to be associated with the dimension.

Embodiment 4

Embodiment 4 will now be described. The same components and functions as in Embodiments 1 to 3 will not be described.

In Embodiments 1 to 3, the element selector 120 selects the first target element and the second target element for creating a dimension from faces, edges, and vertices serving as elements of the 3D model in accordance with the operation of the operator. The direction indicator 130 indicates an appropriate direction in the 3D coordinate system as the direction of the dimension in accordance with the operation of the operator. In Embodiment 4, the element selector 120 selects the first target element and the second target element based on a 2D drawing representing a 3D model in a 2D plane. The direction indicator 130 indicates the direction of the dimension based on the 2D drawing.

Figure 24:
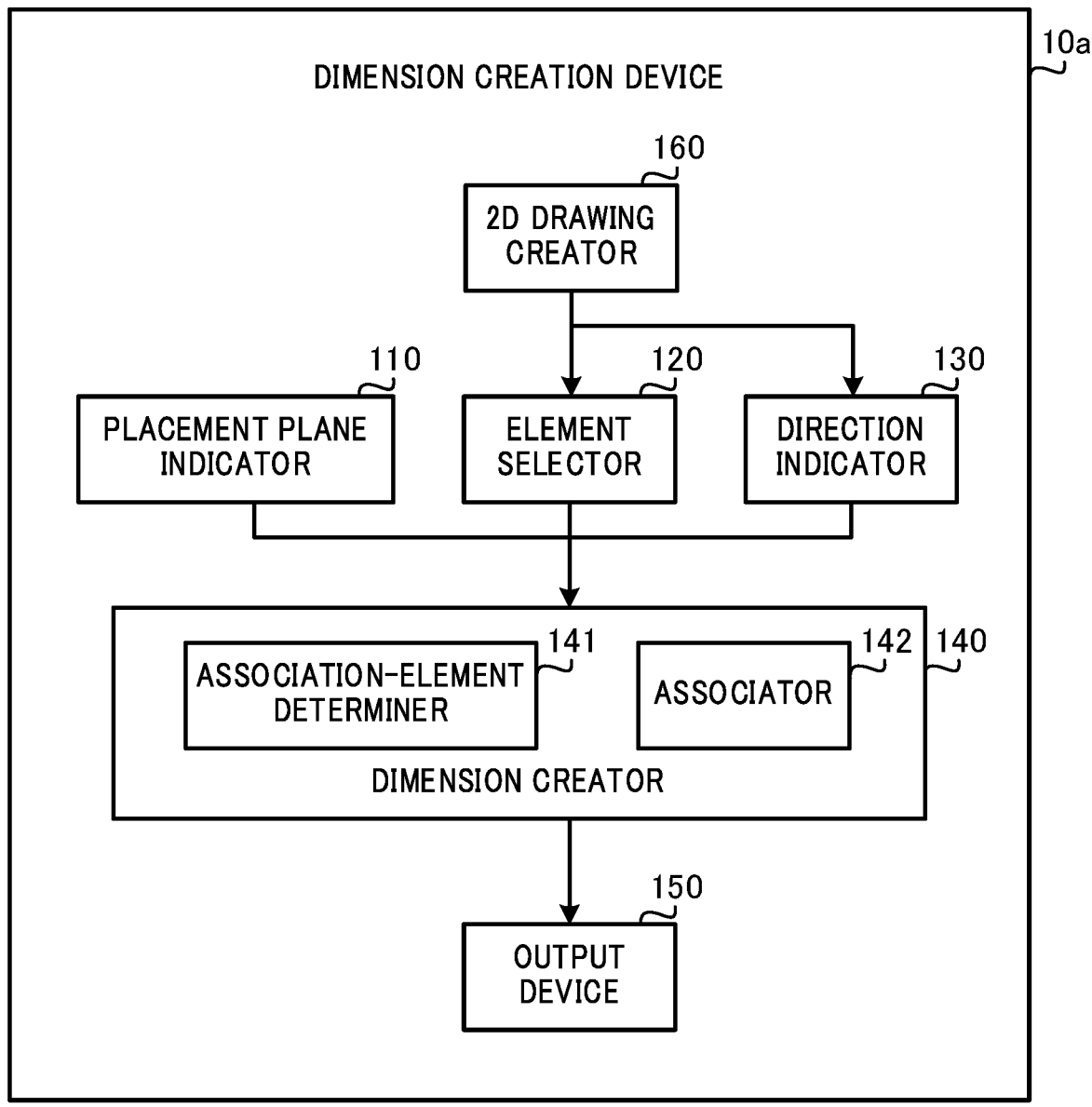
FIG. 24 is a functional block diagram of a dimension creation device according to Embodiment 4.

FIG. 24 is a functional block diagram of a dimension creation device 10a according to Embodiment 4. The dimension creation device 10a according to Embodiment 4 functionally includes a placement plane indicator 110, an element selector 120, a direction indicator 130, a dimension creator 140, an output device 150, and a 2D drawing creator 160. These functions are implemented by software, firmware, or a combination of software and firmware. The software and the firmware are described as programs, and the programs are stored in the ROM or the storage 12. When the CPU executes the programs stored in the ROM or the storage 12, these functions are implemented.

The 2D drawing creator 160 creates, from a 3D model, a 2D drawing corresponding to the 3D model. The 2D drawing represents the 3D model in a 2D plane by projecting the 3D model in the 2D plane with a 3D CAD function.

Figure 25:
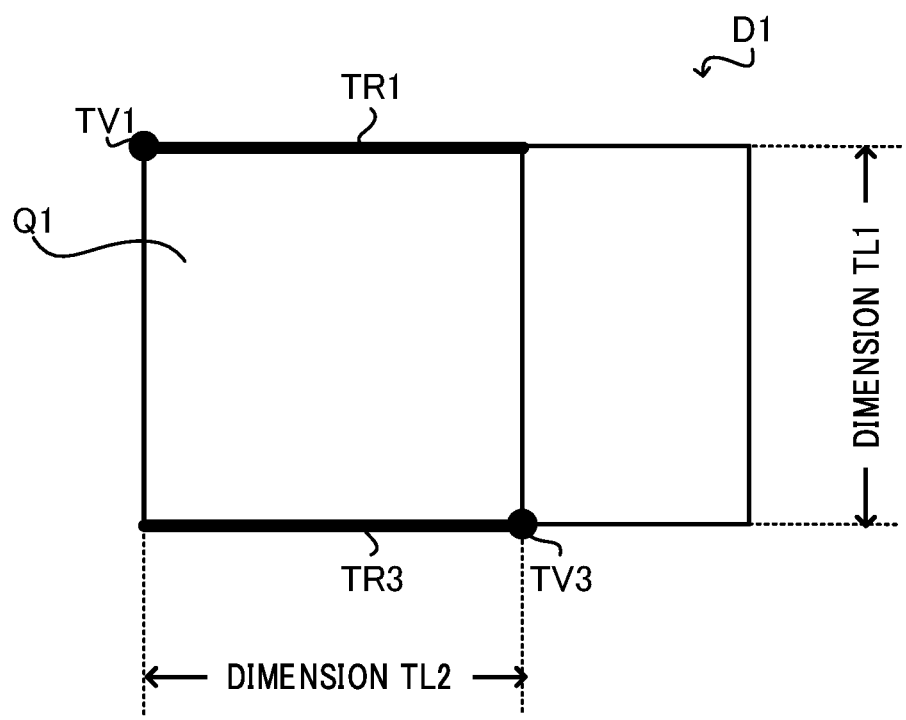
FIG. 25 is a diagram of an example 2D drawing in Embodiment 4.

For example, FIG. 25 shows a 2D drawing D1 of the 3D model M1 shown in FIG. 2. The 2D drawing D1 is created by projecting the 3D model M1 in the 2D plane. More specifically, the 2D drawing D1 includes a projection chart Q1 acquired by projecting the 3D model M1 in the positive Z-direction, with the positive Y-direction in a 3D coordinate system being upward.

The projection chart Q1 shows the shape of the 3D model M1 in the positive Z-direction, or more specifically, when viewed from the faces S1 and S2. The projection chart Q1 includes, among the elements of the 3D model M1, elements corresponding to the edges R1 to R4, R8, R11, and R12 and the vertices V1 to V4, V7, and V8 viewable in the positive Z-direction. For example, edges TR1 and TR3 in the projection chart Q1 correspond to the edges R1 and R3 in the 3D model M1, and vertices TV1 and TV3 in the projection chart Q1 correspond to the vertices V1 and V3 in the 3D model M1.

In addition to the projection chart Q1, the 2D drawing D1 includes information indicating two dimensions TL1 and TL2. The dimensions TL1 and TL2 are dimensions in a 2D coordinate system including the 2D drawing D1. More specifically, the dimension TL1 is the vertical dimension between the edges TR1 and TR3. The dimension TL2 is the lateral dimension between the vertices TV1 and TV3.

With reference to FIG. 26, a process of creating a 2D drawing with the 2D drawing creator 160 will now be described. The 2D drawing creator 160 starts the process shown in FIG. 26 upon receiving, from the operator through the operation receiver 13, an instruction of creating a 2D drawing from a 3D model.

After starting the process of creating a 2D drawing, the 2D drawing creator 160 indicates a projection direction of the 3D model in accordance with the operation of the operator (step S41). For example, to create the 2D drawing D1 shown in FIG. 25 from the 3D model M1 shown in FIG. 2, the operator operates the operation receiver 13 to indicate the positive Z-direction as the projection direction. In another example, to create a 2D drawing by projecting the front face of a 3D model, the operator operates the operation receiver 13 to indicate the direction perpendicular to the front face as the projection direction. In still another example, to create a 2D drawing by projecting a side face of the 3D model, the operator operates the operation receiver 13 to indicate the direction perpendicular to the side face as the projection direction.

Subsequently, the 2D drawing creator 160 indicates a projection position of the 3D model in accordance with the operation of the operator (step S42). The operator operates the operation receiver 13 to indicate any position at which the 2D drawing is created in an area in the 2D plane in which the 3D model is projected.

After indicating the projection direction and the projection position, the 2D drawing creator 160 projects the 3D model in the indicated projection direction and at the projection position (step S43). When, for example, the 3D model M1 shown in FIG. 2 is projected in the positive Z-direction, the projection chart Q1 as shown in FIG. 25 is created as the resultant shape of the 3D model M1 being projected in the 2D plane.

After creating the projection chart, the 2D drawing creator 160 selects target elements for creating a dimension in the 2D drawing in accordance with the operation of the operator, and indicates the direction (step S44). For example, to create the dimension TL1, the operator operates the operation receiver 13 to select the edges TR1 and TR3 as target elements from edges and vertices serving as the elements of the projection chart Q1 and indicate the vertical direction as the direction of the dimension. To create the dimension TL2, the operator operates the operation receiver 13 to select the vertices TV1 and TV3 as target elements from edges and vertices serving as the elements of the projection chart Q1 and indicate the lateral direction as the direction of the dimension.

After selecting the target elements and indicating the direction, the 2D drawing creator 160 creates the dimension in the created 2D drawing (step S45). When, for example, the edges TR1 and TR3 are indicated as the target elements, and the lateral direction is indicated as the direction of the dimension, the 2D drawing creator 160 creates the dimension TL1 in a manner associated with the edges TR1 and TR3. When the vertices TV1 and TV3 are indicated as the target elements, and the vertical direction is indicated as the direction of the dimension, the 2D drawing creator 160 creates the dimension TL2 in a manner associated with the vertices TV1 and TV3.

With the above processes, the 2D drawing creator 160 creates, from a 3D model, a 2D drawing representing the 3D model in a 2D plane. The 2D drawing creator 160 is implemented by the controller 11 operating in cooperation with the operation receiver 13. The 2D drawing creator 160 functions as 2D drawing creation means.

Edges and vertices serving as elements of the 2D drawing are associated with the elements of the 3D model. Thus, when the shape or the dimension of the 3D model changes, the shape or the dimension of the 2D drawing changes accordingly. When, for example, the dimension of the edge R1 of the 3D model M1 changes, the dimension of the edge TR1 corresponding to the edge R1 in the 2D drawing D1 changes accordingly. When the position of the vertex V1 of the 3D model M1 changes, the position of the vertex TV1 corresponding to the vertex V1 in the 2D drawing D1 changes accordingly.

In the manner described above, the dimension creation device 10a according to Embodiment 4 creates the dimension for the 3D model based on the 2D drawing created by the 2D drawing creator 160. As described above, when the 2D drawing D1 including the two dimensions TL1 and TL2 is created by the 2D drawing creator 160, the dimension creation device 10a creates dimensions corresponding to the two dimensions TL1 and TL2 for the 3D model M1.

A process performed for the dimension TL1 will first be described. The element selector 120 selects the first target element and the second target element from the elements of the 3D model M1 based on the edges TR1 and TR3 associated with the dimension TL1 in the 2D drawing D1. More specifically, the element selector 120 specifies the edges TR1 and TR3 associated with the dimension TL1 from edges and vertices serving as the elements of the 2D drawing D1. The edges TR1 and TR3 are target elements of the dimension TL1 selected by the operator upon creation of the dimension TL1.

After specifying the edges TR1 and TR3, the element selector 120 specifies the edges R1 and R3 corresponding to the specified edges TR1 and TR3 from the elements of the 3D model M1. The element selector 120 then selects the specified edges R1 and R3 as the first target element and the second target element.

The element selector 120 may determine either one of the edges R1 and R3 as the first target element or as the second target element. For example, the element nearer the origin of the coordinate may be determined as the first target element in accordance with a rule.

The direction indicator 130 indicates the direction of the target dimension in the coordinate system of the 3D model M1 based on the direction of the dimension TL1 in the 2D drawing D1. The direction indicator 130 first specifies the vertical direction that is the direction of the dimension TL1 in the 2D drawing D1. The direction indicator 130 then calculates the direction corresponding to the direction of the dimension TL1 in the coordinate system of the 3D model M1 based on the projection direction of the 3D model M1 upon creation of the 2D drawing D1.

More specifically, as described above, the projection chart Q1 included in the 2D drawing D1 is created by projecting the 3D model M1 in the positive Z-direction, with the positive Y-direction being upward. Thus, the vertical direction in the 2D drawing D1 corresponds to the Y-direction in the coordinate system of the 3D model M1.

In this manner, the direction indicator 130 specifies the directional correspondence between the coordinate system of the 2D drawing D1 and the coordinate system of the 3D model M1 from the projection direction of the 3D model M1 upon creation of the 2D drawing D1. The direction indicator 130 then calculates, based on the directional correspondence, the direction corresponding to the direction of the dimension TL1 in the 3D coordinate system as the Y-direction. The direction indicator 130 indicates the calculated Y-direction as the direction of the dimension created for the 3D model M1.

After the element selector 120 selects the edges R1 and R3 as the two target elements and the direction indicator 130 indicates the Y-direction as the direction of the dimension, the dimension creator 140 creates the dimension in the indicated Y-direction between the selected edges R1 and R3. The process performed by the dimension creator 140 is the same as the process described in Embodiment 1, and is not described. In the manner as in FIG. 11, the dimension L1 associated with the faces S5 and S6 is finally created for the 3D model M1.

A process performed for the dimension TL2 will now be described. The element selector 120 selects the first target element and the second target element from the elements of the 3D model M1 based on the vertices TV1 and TV3 associated with the dimension TL2 in the 2D drawing D1. More specifically, the element selector 120 specifies the vertices TV1 and TV3 associated with the dimension TL2 from edges and vertices serving as the elements of the 2D drawing D1. The vertices TV1 and TV3 are target elements of the dimension TL2 selected by the operator upon creation of the dimension TL2.

After specifying the vertices TV1 and TV3, the element selector 120 specifies the vertices V1 and V3 corresponding to the specified vertices TV1 and TV3 from the elements of the 3D model M1. The element selector 120 selects the specified vertices V1 and V3 as the first target element and the second target element.

The element selector 120 may determine either one of the vertices V1 and V3 as the first target element or as the second target element. For example, the element nearer the origin of the coordinate may be determined as the first target element in accordance with a rule.

The direction indicator 130 indicates the direction of the target dimension in the coordinate system of the 3D model M1 based on the direction of the dimension TL2 in the 2D drawing D1. The direction indicator 130 first specifies the lateral direction that is the direction of the dimension TL2 in the 2D drawing D1. The direction indicator 130 then calculates the direction corresponding to the direction of the dimension TL2 in the coordinate system of the 3D model M1 based on the projection direction of the 3D model M1 upon creation of the 2D drawing D1.

More specifically, the lateral direction that is the direction of the dimension TL2 in the 2D drawing D1 corresponds to the X-direction in the coordinate system of the 3D model M1. Thus, the direction indicator 130 calculates, based on this directional correspondence, the direction corresponding to the direction of the dimension TL2 in the 3D coordinate system as the X-direction. The direction indicator 130 indicates the calculated X-direction as the direction of the dimension created for the 3D model M1.

After the element selector 120 selects the vertices V1 and V3 as the two target elements and the direction indicator 130 indicates the X-direction as the direction of the dimension as above, the dimension creator 140 creates the dimension in the indicated X-direction between the selected vertices V1 and V3. The process performed by the dimension creator 140 is the same as the process described in Embodiment 1, and is not described. In the same manner as in FIG. 13, the dimension L2 associated with the face S4 and the edge R4 is finally created for the 3D model M1.

As described above, the dimension creation device 10a according to Embodiment 4 selects the first target element and the second target element and indicates the direction of the target dimension based on the 2D drawing representing the 3D model in the 2D plane. When a 3D model created in the past and a 2D drawing created by projecting the 3D model are available, a dimension correctly associated with elements of the 3D model can be automatically created without the operator selecting target elements from the 3D model or indicating the direction. This structure can enhance the work efficiency.

In the example described above, the 2D drawing D1 includes the projection chart Q1 acquired by projecting the 3D model M1 in the positive Z-direction. However, the 2D drawing may include multiple projection charts acquired by projecting the 3D model in multiple directions, and a dimension may be created for each of the multiple projection charts. For a dimension created for each of the multiple projection charts, the dimension creation device 10a can create the dimensions corresponding to all the dimensions included in the 2D drawing for the 3D model by performing the processes similar to the above processes on all the dimensions.

In the example described above, the dimension creation device 10a functions as the 2D drawing creator 160. However, the dimension creation device 10a may not function as the 2D drawing creator 160. In other words, the dimension creation device 10a may not create a 2D drawing from a 3D model, but may acquire a 2D drawing created by another device having a 3D CAD function to perform the above process on the acquired 2D drawing.

In the example described above, the 2D drawing is created by projecting a 3D model. Thus, the elements of the 2D drawing and the elements of the 3D model are associated with each other upon creation of the 3D model. However, a 2D drawing representing a 3D model in a 2D plane may be created in any manner other than being created by projecting the 3D model. For example, a 2D drawing may be printed matter or an image representing the shape of a 3D model viewed in a specific direction.

When the 2D drawing is created in a manner other than projecting a 3D model, the element selector 120 extracts a dimension from the 2D drawing through an image analysis of the 2D drawing, and specifies a line in the 2D drawing to which the dimensional line of the dimension is connected. The element selector 120 then matches the shapes of the 2D drawing and the 3D model with each other to specify the elements of the 3D model corresponding to the extracted line in the 2D drawing. The direction indicator 130 matches the shapes of the 2D drawing and the 3D model with each other to specify the directional correspondence between the coordinate system of the 2D drawing and the coordinate system of the 3D model. The direction indicator 130 then calculates the direction in the coordinate system of the 3D model corresponding to the direction of the dimension extracted from the 2D drawing. As described above, irrespective of the elements of the 2D drawing and the elements of the 3D model not associated with each other upon creation of the 3D model, the dimension creation device 10a can create a dimension associated with the elements of the 3D model.

Modifications

The embodiments of the present disclosure described above may be modified or applied in various forms to implement the present disclosure.

For example, in the above embodiments, the functions of the dimension creation devices 10 and 10a are described using the 3D models M1 to M3. However, the 3D models M1 to M3 are mere examples. A dimension may be created for a 3D model having another solid shape in the manner described in the above embodiments.

In the above embodiments, the association-element determiner 141 determines whether the 3D model M1 includes a first orthogonal face or a second orthogonal face by determining whether any face is orthogonal to the direction indicated by the direction indicator 130. However, when a plane parallel to the direction of the dimension is indicated as the dimension placement plane P1 or P2, being orthogonal to the direction indicated by the direction indicator 130 corresponds to being perpendicular to the dimension placement plane P1 or P2. Thus, the association-element determiner 141 may determine whether the 3D model M1 includes any face orthogonal to the direction indicated by the direction indicator 130 by determining whether the 3D model M1 has a face perpendicular to the dimension placement plane P1 or P2.

In the above embodiments, the dimension creation device 10 or 10a includes the operation receiver 13 and the display 14. However, the dimension creation device 10 or 10a may eliminate the operation receiver 13 and the display 14. In other words, the dimension creation device 10 or 10a may not have the function of a user interface. In this case, the dimension creation device 10 or 10a receives an operation from the operator through an external input device and displays an image on the external display device.

In the above embodiments, the CPU in the controller 11 in the dimension creation device 10 or 10a executes a program stored in the ROM or the storage 12 to function as each unit shown in FIG. 4 or 24. However, the controller 11 may be dedicated hardware. Examples of the dedicated hardware include a single circuit, a complex circuit, a programmed processor, an application-specific integrated circuit (ASIC), a field-programmable gate array (FPGA), or a combination of two or more of these. When the controller 11 is dedicated hardware, the function of each unit may be implemented by individual hardware devices, or the functions of the units may be collectively implemented by a single hardware device.

Some functions of the unit may be implemented by dedicated hardware, and others may be implemented by software or firmware. The controller 11 can thus implement the above functions with hardware, software, firmware, or a combination of two or more of these.

When a program defining the operation of the dimension creation device 10 or 10a according to one or more embodiments of the present disclosure is applied to an existing computer such as a personal computer or an information terminal, the computer can function as the dimension creation device 10 or 10a according to one or more embodiments of the present disclosure.

The above program may be distributed in any method. For example, the program may be stored in a non-transitory computer-readable recording such as a compact disk ROM (CD-ROM), a digital versatile disk (DVD), a magneto-optical disk (MO), or a memory card for distribution or may be distributed through a communication network such as the Internet.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2020-022114, filed on Feb. 13, 2020, the entire disclosure of which is incorporated by reference herein.

REFERENCE SIGNS LIST 10, 10a Dimension creation device
11 Controller
12 Storage
13 Operation receiver
14 Display
15 Communicator
110 Placement plane indicator
120 Element selector
130 Direction indicator
140 Dimension creator
141 Association-element determiner
142 Associator
150 Output device
160 Two-dimensional (2D) drawing creator
A1, A2 Cylinder axis
D1 Two-dimensional (2D) drawing
L1 to L4, TL1, TL2 Dimension
M1 to M3 3D model
P1, P2 Dimension placement plane
Q1 Projection chart
R1 to R14, R21 to R32, TR1, TR3 Edge
S1 to S6, S21 to S27 Face
S10, S11 Cylindrical face
V1 to V8, V21 to V28, TV1, TV3 Vertex

The invention claimed is:
1. A dimension creation device, comprising:
element selecting circuitry to receive selection of a first target element and a second target element from elements of a three-dimensional model in a first viewing plane, the three-dimensional (3D) model including an arrangement of plural faces, plural edges, and plural vertices, wherein each of the selected first target element and the selected second target element includes a vertex of the plural vertices or an edge of the plural edges;
direction indicating circuitry to receive a direction of a dimension to be created in the first viewing plane; and
dimension creating circuitry including:
 association-element determining circuitry that identifies two elements of the 3D model that are associated with the dimension to be created, the association-element determining circuitry:
  determining whether the first target element is part of a first orthogonal face of the plural faces by identifying each of the plural faces that includes the first target element and determining whether one of the plural faces that includes the first target element is orthogonal to the direction of the dimension to be created;

determining whether the second target element is part of a second orthogonal face of the plural faces by identifying each of the plural faces that includes the second target element and determining whether one of the plural faces that includes the second target element is orthogonal to the direction of the dimension to be created; and identifying one of the vertex, the edge, the first orthogonal face, or the second orthogonal face as a first association element or a second association element based on the determinations of the first target element and the second target element, and the direction of the dimension to be created, wherein:

when the association-element determining circuitry determines that one of the plural faces that includes the first target element is orthogonal to the direction of the dimension to be created, the association element determining circuitry identifies the first orthogonal face as the first association element, when the association-element determining circuitry determines that one of the plural faces that includes the second target element is orthogonal to the direction of the dimension to be created, the association element determining circuitry identifies the second orthogonal face as the second association element, when none of the plural faces that includes the first target element is orthogonal to the direction of the dimension to be created, the association element determining circuitry identifies the vertex or the edge selected as the first target element as the first association element, and when none of the plural faces that includes the second target element is orthogonal to the direction of the dimension to be created, the association element determining circuitry identifies the vertex or the edge selected as the second target element as the second association element; and associating circuitry to associate the dimension to be created with the first association element and the second association element that are identified by the association-element determining circuitry, wherein the dimension creating circuitry creates the dimension in the first viewing plane between the first target element and the second target element in the direction indicated by the direction indicating circuitry based on the first association element and the second association element identified by the association-element determining circuitry.

2. The dimension creation device according to claim 1, wherein the association-element determining circuitry determines, when the element selecting circuitry selects a vertex as the first target element, whether the three-dimensional model includes a first orthogonal edge including the vertex selected by the element selecting circuitry and orthogonal to the direction indicated by the direction indicating circuitry, and determines the vertex selected by the element selecting circuitry as the first association element when the three-dimensional model does not include the first orthogonal edge, and the association-element determining circuitry determines, when the element selecting circuitry selects a vertex as the second target element, whether the three-dimensional model includes a second orthogonal edge including the vertex selected by the element selecting circuitry and orthogonal to the direction indicated by the direction indicating circuitry, and determines the vertex selected by the element selecting circuitry as the second association element when the three-dimensional model does not include the second orthogonal edge.

3. The dimension creation device according to claim 2, wherein the association-element determining circuitry further determines, when the three-dimensional model includes the first orthogonal edge, whether the three-dimensional model includes the first orthogonal face, determines the first orthogonal face as the first association element when the three-dimensional model includes the first orthogonal face, and determines the first orthogonal edge as the first association element when the three-dimensional model does not include the first orthogonal face, and the association-element determining circuitry further determines, when the three-dimensional model includes the second orthogonal edge, whether the three-dimensional model includes the second orthogonal face, determines the second orthogonal face as the second association element when the three-dimensional model includes the second orthogonal face, and determines the second orthogonal edge as the second association element when the three-dimensional model does not include the second orthogonal face.

4. The dimension creation device according to claim 1, wherein the association-element determining circuitry determines, when the element selecting circuitry selects a circular edge as the first target element and the three-dimensional model includes a first orthogonal cylindrical face including the circular edge and a cylinder axis orthogonal to the direction indicated by the direction indicating circuitry, the first orthogonal cylindrical face as a first association element, and the association-element determining circuitry determines, when the element selecting circuitry selects a circular edge as the second target element and the three-dimensional model includes a second orthogonal cylindrical face including the circular edge and a cylinder axis orthogonal to the direction indicated by the direction indicating circuitry, the second orthogonal cylindrical face as a second association element.

5. The dimension creation device according to claim 4, wherein the association-element determining circuitry determines, when the element selecting circuitry selects a circular edge as the first target element and the three-dimensional model does not include the first orthogonal cylindrical face, the circular edge as the first association element, and the association-element determining circuitry determines, when the element selecting circuitry selects a circular edge as the second target element and the three-dimensional model does not include the second orthogonal cylindrical face, the circular edge as the second association element.

6. The dimension creation device according to claim 1, wherein when the three-dimensional model includes at least one different element different from the first association element and the second association element in an imaginary plane including at least one of the first association element or the second association element and orthogonal to the direction indicated by the direction indicating circuitry, the dimension creating circuitry creates the dimension in a manner further associated with the at least one different element in addition to the first association element and the second association element.

7. The dimension creation device according to claim 1, wherein
when at least one of the first association element or the second association element is a cylindrical face, and an imaginary plane including a cylinder axis of the cylindrical face and orthogonal to the direction indicated by the direction indicating circuitry includes a cylinder axis of at least one different cylindrical face different from the first association element and the second association element, the dimension creating circuitry creates the dimension in a manner further associated with the at least one different cylindrical face in addition to the first association element and the second association element.

8. The dimension creation device according to claim 1, further comprising:
placement-plane indicating circuitry to indicate a dimension placement plane in which the dimension is placed, wherein the dimension creating circuitry creates the dimension in the dimension placement plane indicated by the placement-plane indicating circuitry.

9. The dimension creation device according to claim 1, wherein
the direction indicating circuitry further indicates a position at which the dimension is placed, and
the dimension creating circuitry creates the dimension at the position indicated by the direction indicating circuitry.

10. The dimension creation device according to claim 1, wherein
the element selecting circuitry selects the first target element and the second target element based on a two-dimensional drawing representing the three-dimensional model in a two-dimensional plane, and
the direction indicating circuitry indicates the direction of the dimension to be created based on the two-dimensional drawing.

11. The dimension creation device according to claim 10, wherein
the element selecting circuitry specifies an edge or a vertex associated with a dimension created in the two-dimensional drawing from elements of the two-dimensional drawing, and selects, from the elements of the three-dimensional model, an edge or a vertex corresponding to the specified edge or the specified vertex as each of the first target element and the second target element, and
the direction indicating circuitry specifies a direction of the dimension created in the two-dimensional drawing, and indicates, in a coordinate system of the three-dimensional model, a direction corresponding to the specified direction as the direction of the dimension to be created.

12. A dimension creation method, comprising:
selecting, by a controller of a computing device, a first target element and a second target element from elements of a three-dimensional model in a first viewing plane, the three-dimensional model including an arrangement of plural faces, plural edges, and plural vertices, wherein each of the selected first target element and the selected second target element includes a vertex of the plural vertices or an edge of the plural edges;
receiving, by an operation receiver of the computing device, a direction of a dimension to be created in the first viewing plane;
identifying, by the controller of the computing device, two elements of the 3D model that are associated with the dimension to be created;
determining, by the controller of the computing device, whether the first target element is part of a first orthogonal face of the plural faces by identifying each of the plural faces that includes the first target element and determining whether one of the plural faces that includes the first target element is orthogonal to the direction of the dimension to be created;
determining, by the controller of the computing device, whether the second target element is part of a second orthogonal face of the plural faces by identifying each of the plural faces that includes the second target element and determining whether one of the plural faces that includes the second target element is orthogonal to the direction of the dimension to be created; and
identifying, by the controller of the computing device, one of the vertex, the edge, the first orthogonal face, or the second orthogonal face as a first association element or a second association element based on the determinations of the first target element and the second target element, and the direction of the dimension to be created, wherein:
when one of the plural faces that includes the first target element is orthogonal to the direction of the dimension to be created, identifying the first orthogonal face as the first association element,
when one of the plural faces that includes the second target element is orthogonal to the direction of the dimension to be created, identifying the second orthogonal face as the second association element,
when none of the plural faces that includes the first target element is orthogonal to the direction of the dimension to be created, identifying the vertex or the edge selected as the first target element as the first association element, and
when none of the plural faces that includes the second target element is orthogonal to the direction of the dimension to be created, identifying the vertex or the edge selected as the second target element as the second association element;
associating, by the controller of the computing device, the dimension to be created with the first association element and the second association element; and
creating, by the controller of the computing device, the dimension in the first viewing plane between the first target element and the second target element in a specified direction based on the first association element and the second association element.

13. A non-transitory computer-readable recording medium storing a program, the program causing a computer to:
receive selection of a first target element and a second target element from elements of a three-dimensional model in a first viewing plane, the three-dimensional model including an arrangement of plural faces, plural edges, and plural vertices, wherein each of the selected first target element and the selected second target element includes a vertex of the plural vertices or an edge of the plural edges, receive a direction of a dimension to be created in the first viewing plane, and identify two elements of the 3D model that are associated with the dimension to be created;

determine whether the first target element is part of a first orthogonal face of the plural faces by identifying each of the plural faces that includes the first target element and determining whether one of the plural faces that includes the first target element is orthogonal to the direction of the dimension to be created;

determine whether the second target element is part of a second orthogonal face of the plural faces by identifying each of the plural faces that includes the second target element and determining whether one of the plural faces that includes the second target element is orthogonal to the direction of the dimension to be created; and identify one of the vertex, the edge, the first orthogonal face, or the second orthogonal face as a first association element or a second association element based on the determinations of the first target element and the second target element, and the direction of the dimension to be created, wherein:

when one of the plural faces that includes the first target element is orthogonal to the direction of the dimension to be created, identify the first orthogonal face as the first association element, when one of the plural faces that includes the second target element is orthogonal to the direction of the dimension to be created, identify the second orthogonal face as the second association element, when none of the plural faces that includes the first target element is orthogonal to the direction of the dimension to be created, identify the vertex or the edge selected as the first target element as the first association element, and when none of the plural faces that includes the second target element is orthogonal to the direction of the dimension to be created, identify the vertex or the edge selected as the second target element as the second association element;

associate the dimension to be created with the first association element and the second association element; and create the dimension in the first viewing plane between the first target element and the second target element in a specified direction based on the first association element and the second association element.

* * * * *